United States Patent
Shen et al.

(10) Patent No.: US 11,757,461 B2
(45) Date of Patent: Sep. 12, 2023

(54) CONTINUOUS-TIME INPUT-STAGE SUCCESSIVE APPROXIMATION REGISTER ANALOG-TO-DIGITAL CONVERTER

(71) Applicant: BOARD OF REGENTS, THE UNIVERSITY OF TEXAS SYSTEM, Austin, TX (US)

(72) Inventors: Linxiao Shen, Austin, TX (US); Nan Sun, Austin, TX (US)

(73) Assignee: BOARD OF REGENTS, THE UNIVERSITY OF TEXAS SYSTEM, Austin, TX (US)

( * ) Notice: Subject to any disclaimer, the term of this patent is extended or adjusted under 35 U.S.C. 154(b) by 0 days.

(21) Appl. No.: 17/638,980

(22) PCT Filed: Feb. 12, 2020

(86) PCT No.: PCT/US2020/017902
§ 371 (c)(1),
(2) Date: Feb. 28, 2022

(87) PCT Pub. No.: WO2021/040788
PCT Pub. Date: Mar. 4, 2021

(65) Prior Publication Data
US 2022/0337258 A1 Oct. 20, 2022

Related U.S. Application Data

(60) Provisional application No. 62/893,065, filed on Aug. 28, 2019.

(51) Int. Cl.
*H03M 1/10* (2006.01)
*H03M 1/06* (2006.01)
(Continued)

(52) U.S. Cl.
CPC ............ *H03M 1/0695* (2013.01); *H03M 1/00* (2013.01); *H03M 1/10* (2013.01); *H03M 1/12* (2013.01); *H03M 1/34* (2013.01)

(58) Field of Classification Search
CPC ........ H03M 1/0695; H03M 1/12; H03M 1/10; H03M 1/00; H03M 1/34
See application file for complete search history.

(56) References Cited

U.S. PATENT DOCUMENTS 6,124,818 A * 9/2000 Thomas ................ H03M 1/164
341/161
6,538,588 B1 * 3/2003 Bazarjani ................ H03M 3/47
341/143
(Continued)

OTHER PUBLICATIONS

International Search Report and Written Opinion dated Jun. 5, 2020, from International Application No. PCT/US2020/017902, 10 pages.
(Continued)

*Primary Examiner* — Joseph J Lauture
(74) *Attorney, Agent, or Firm* — Meunier Carlin & Curfman LLC

(57) ABSTRACT

The exemplified disclosure presents a successive approximation register analog-to-digital converter circuit that comprises a two-step (e.g., two-stage) analog-to-digital converter (ADC) that operates a 1st-stage successive approximation register (SAR) in the continuous time (CT) domain (also referred to as a "1-st stage CTSAR") that then feeds a sampling operation location in the second stage. Without a front-end sampling circuit in the 1st-stage, the exemplary successive approximation analog-to-digital converter circuit can avoid high sampling noise associated with such sampling operation and thus can be configured with a substantially smaller input capacitor size (e.g., at least 20 times smaller) as compared to conventional Nyquist ADC with a front-end sample-and-hold circuit.

25 Claims, 16 Drawing Sheets

(51) Int. Cl.
  *H03M 1/34* (2006.01)
  *H03M 1/00* (2006.01)
  *H03M 1/12* (2006.01)

(56) References Cited

U.S. PATENT DOCUMENTS

| | | |
|---|---|---|
| 7,978,117 B2 | 7/2011 | Jeon et al. |
| 9,774,344 B2 | 9/2017 | Shibata |
| 2002/0067303 A1* | 6/2002 | Lee .................. H04N 5/378 348/E3.018 |
| 2011/0052869 A1 | 3/2011 | Hrdina et al. |

OTHER PUBLICATIONS

H. Shibata et al., "A 9-GS/s 1.125-GHz BW Oversampling Continuous-Time Pipeline ADC Achieving—164-dBFS/Hz NSD", IEEE JSSC, vol. 52, No. 12, pp. 3219-3234, Dec. 2017.
D. Gubbins et al., "Continuous-Time Input Pipeline ADCs", IEEE JSSC, vol. 45, No. 8, pp. 1456-1468, Aug. 2010.
M. S. Akter et al., "A Capacitively Degenerated 100-dB Linear 20-150 MS/s Dynamic Amplifier", IEEE JSSC, vol. 53, No. 4, pp. 1115-1126, Apr. 2018.
S. Li et al., "A 13-ENOB Second-Order Noise-Shaping SAR ADC Realizing Optimized NTF Zeros Using the Error-Feedback Structure", ISSCC, pp. 234-236, Feb. 2018.
P. Harpe et al., "An Oversampled 12/14b SAR ADC with Noise Reduction and Linearity Enhancements Achieving up to 79.1dB SNDR", ISSCC, pp. 194-195, Feb. 2014.
M. Shim et al., "Edge-Pursuit Comparator: an Energy-Scalable Oscillator Collapse-Based Comparator With Application in a 74.1 dB SNDR and 20 kS/s 15 b SAR ADC", IEEE JSSC, vol. 52, No. 4, pp. 1077-1090, Apr. 2017.
Y. Lim and M. P. Flynn, "A 1mW 71.5dB SNDR 50MS/S 13b Fully Differential Ring-amplifier-based SAR-Assisted Pipeline ADC", ISSCC, pp. 458-459, Feb. 2015.
B. Verbruggen, J. Tsouhlarakis, T. Yamamoto, M. Iriguchi, E. Martens and J. Craninckx, "A 60 dB SNDR 35 MS/s SAR ADC with comparator-noise-based stochastic residue estimation", IEEE J. Solid-State Circuits, vol. 50, No. 9, pp. 2002-2011, Sep. 2015.
L. Chen, X. Tang, A. Sanyal, Y. Yoon, J. Cong and N. Sun, "A 0.7-V 0.6-μW 100-kS/s Low-Power SAR ADC With Statistical Estimation-Based Noise Reduction", IEEE J. Solid-State Circuits, vol. 52, No. 5, pp. 1388-1398, May 2017.
B. Hershberg, S. Weaver, K. Sobue, S. Takeuchi, K. Hamashita and U .- K. Moon, "Ring amplifiers for switched-capacitor circuits", Proc. IEEE Int. Solid-State Circuits Conf., pp. 460-462, Feb. 2012.
Y. Lim and M. P. Flynn, "A 1 mW 71.5 dB SNDR 50 MS/s 13 bit fully differential ring amplifier based SAR-assisted pipeline ADC", IEEE J. Solid-State Circuits, vol. 50, No. 12, pp. 2901-2911, Dec. 2015.
H. Huang, H. Xu, B. Elies and Y. Chiu, " A non-interleaved 12-b 330-MS/s pipelined-SAR ADC with PVT-stabilized dynamic amplifier achieving sub-1-dB SNDR variation", IEEE J. Solid-State Circuits, vol. 52, No. 12, pp. 3235-3247, Dec. 2017.
H. Li, M. Maddox, M. C. W. Coin, W. Buckley, D. Hummerston and N. Naeem, "A signal-independent background-calibrating 20 b 1 MS/S SAR ADC with 0.3 ppm INL", IEEE Int. Solid-State Circuits Conf. (ISSCC) Dig. Tech. Papers, pp. 242-244, Feb. 2018.
B. Verbruggen, K. Deguchi, B. Malki and J. Craninckx, "A 70 dB SNDR 200 MS/s 2.3 mW dynamic pipelined SAR ADC in 28 nm digital CMOS", Symp. VLSI Circuits Dig. Tech. Papers, pp. 1-2, Jun. 2014.
M. Ding, P. Harpe, Y.-H. Liu, B. Busze, K. Philips and H. de Groot, "26.2 A 5.5 f J/conv-step 6.4 MS/S 13 b SAR ADC utilizing a redundancy-facilitated background error-detection-and-correction scheme", IEEE Int. Solid-State Circuits Conf. (ISSCC) Dig. Tech. Papers, pp. 1-3, Feb. 2015.

Y.-S. Shu and B.-S. Song, "A 15-bit linear 20-MS/s pipelined ADC digitally calibrated with signal-dependent dithering", IEEE J. Solid-State Circuits, vol. 43, No. 2, pp. 342-350, Feb. 2008.
Y. Zhou, B. Xu and C. Yun, "A 12 bit 160 MS/s two-step SAR ADC with background bit-weight calibration using a time-domain proximity detector", IEEE J. Solid-State Circuits, vol. 50, No. 4, pp. 920-931, Apr. 2015.
A. Bannon, C. P. Hurrell, D. Hummerston and C. Lyden, "An 18 b 5 MS/s SAR ADC with 100.2 dB dynamic range", Symp. VLSI Circuits Dig. Tech. Papers, pp. 1-2, Jun. 2014.
S. W. M. Chen and R. W. Brodersen, "A 6-bit 600-MS/s 5.3-mW Asynchronous ADC in 0.13-μm CMOS", IEEE Int. Solid-State Circuits Conf. (ISSCC) Dig. Tech. Papers, vol. 41, pp. 574-575, Feb. 2006.
V. Tripathi and B. Murmann, "An 8-bit 450-MS/s single-bit/cycle SAR ADC in 65-nm CMOS", Proc. ESSCIRC, pp. 117-120, Sep. 2013.
P. Harpe, C. Zhou, X. Wang, G. Dolmans and H. de Groot, "A 30 fJ/conversion-step 8 b 0-to-10 MS/s asynchronous SAR ADC in 90 nm CMOS", IEEE Int. Solid-State Circuits Conf. (ISSCC) Dig. Tech. Papers, pp. 388-389, Feb. 2010.
M. Zhang, K. Noh, X. Fan and E. Sánchez-Sinencio, "A 0.8-1.2 V 10-50 MS/s 13-bit subranging pipelined-SAR ADC using a temperature-insensitive time-based amplifier", IEEE J. Solid-State Circuits, vol. 52, No. 11, pp. 2991-3005, Nov. 2017.
J. Lin, D. Paik, S. Lee, M. Miyahara and A. Matsuzawa, "An ultra-low-voltage 160 MS/s 7 Bit interpolated pipeline ADC using dynamic amplifiers", IEEE J. Solid-State Circuits, vol. 50, No. 6, pp. 1399-1411, Jun. 2015.
C.-C. Liu and M.-C. Huang, "28.1 A 0.46 mW 5 MHz-BW 79.7 dB-SNDR noise-shaping SAR ADC with dynamic-amplifier-based FIR-IIR filter", IEEE Int. Solid-State Circuits Conf. (ISSCC) Dig. Tech. Papers, pp. 466-467, Feb. 2017.
L. Shen, Y. Shen, X. Tang, C. Hsu, W. Shi, S. Li, W. Zhao, A. Mukherjee, and N. Sun, "3.4 A 0.01mm2 25W 2MS/s 74dB-SNDR Continuous-Time Pipelined-SAR ADC with 120fF Input Capacitor," in 2019 IEEE International Solid-State Circuits Conference—(ISSCC), pp. 64-66, Feb. 2019.
R. R. Harrison et al., "A low-power integrated circuit for a wireless 100-electrode neural recording system", IEEE J. Solid-State Circuits, vol. 42, No. 1, pp. 123-133, Jan. 2007.
L. Shen, N. Lu and N. Sun, " A 1-V 0.25-μW Inverter Stacking Amplifier With 1.07 Noise Efficiency Factor", IEEE J. Solid-State Circuits, vol. 53, No. 3, pp. 896-905, Mar. 2018.
W. Kim et al., "A 0.6 V 12 b 10 MS/s low-noise asynchronous SAR-assisted time-interleaved SAR (SATI-SAR) ADC", IEEE J. Solid-State Circuits, vol. 51, No. 8, pp. 1826-1839, Aug. 2016.
J. Guerber, H. Venkatram, M. Gande and U. Moon, "A 10-b ternary Sar Adc with quantization time information utilization", IEEE J. Solid-State Circuits, vol. 47, No. 11, pp. 2604-2613, Nov. 2012.
C. C. Lee and M. P. Flynn, "A SAR-assisted two-stage pipeline ADC", IEEE J. Solid-State Circuits, vol. 46, No. 4, pp. 859-869, Apr. 2011.
H. Garvik, C. Wulff and T. Ytterdal, "An 11.0 bit ENOB 9.8 fJ/conv.-step noise-shaping SAR ADC calibrated by least squares estimation", Proc. IEEE Custom Integr. Circuits Conf. (CICC), pp. 1-4, Apr./May 2017.
M. Gandara, P. Gulati and N. Sun, "A 172 dB-FoM pipelined SAR ADC using a regenerative amplifier with self-timed gain control and mixed-signal background calibration", Proc. IEEE Asian Solid-State Circuits Conf. (A-SSCC), pp. 297-300, Nov. 2017.
S. Li, B. Qiao, M. Gandara, D. Z. Pan and N. Sun, "A 13-ENOB second-order noise-shaping SAR ADC realizing optimized NTF zeros using the error-feedback structure", IEEE J. Solid-State Circuits, vol. 53, No. 12, pp. 3484-3496, Dec. 2018.
M. Gandara, W. Guo, X. Tang, L. Chen, Y. Yoon and N. Sun, "A pipelined SAR ADC reusing the comparator as residue amplifier", Proc. IEEE Custom Integr. Circuits Conf. (CICC), pp. 1-4, Apr./May 2017.

* cited by examiner

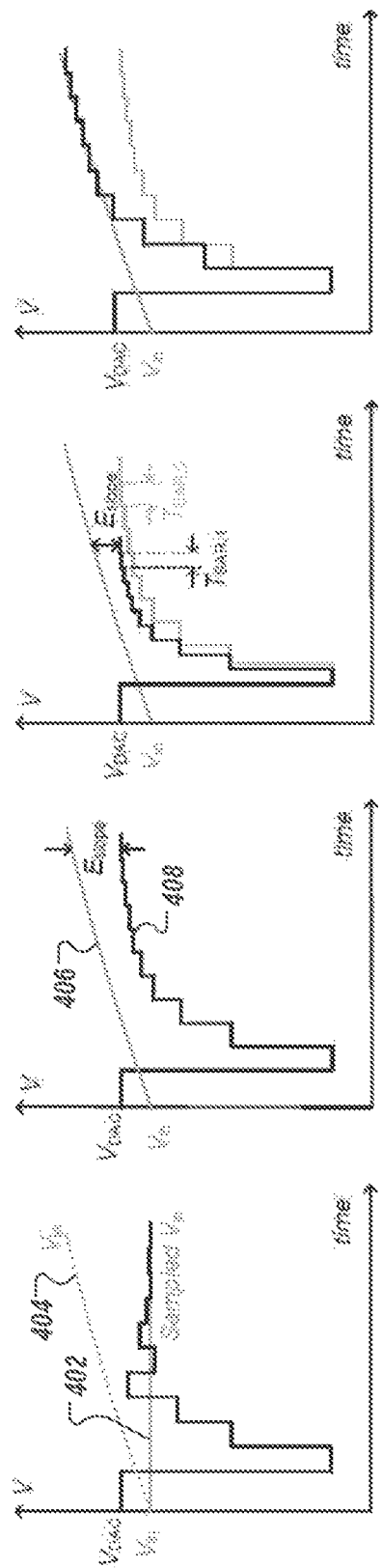

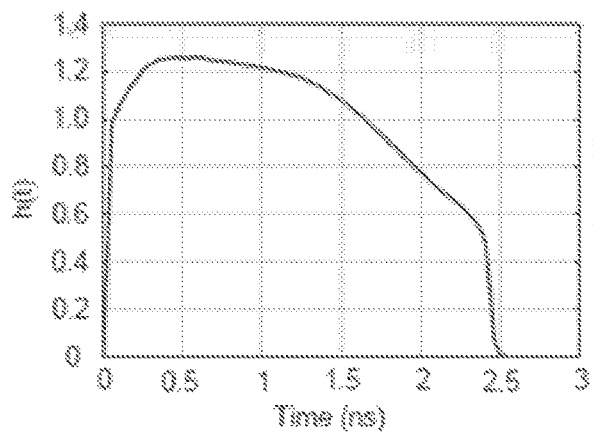 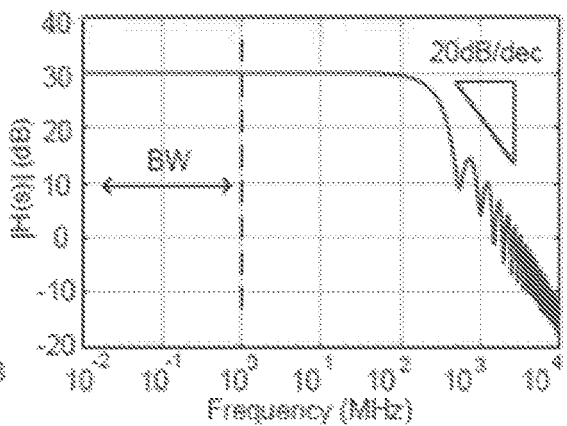
FIG. 11A    FIG. 11B
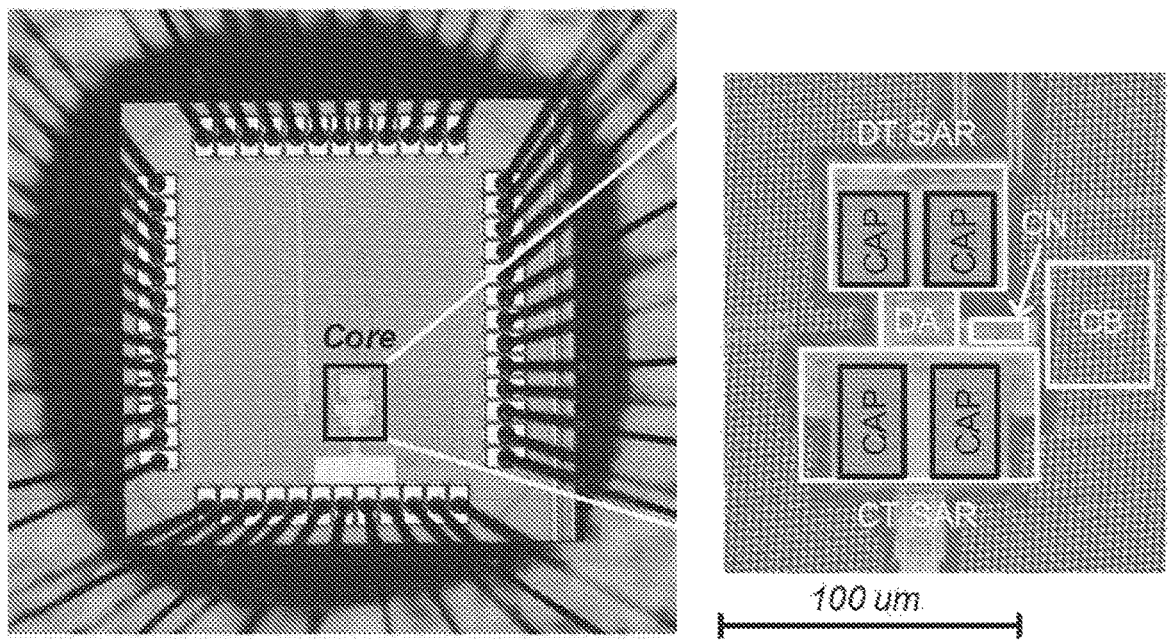
FIG. 12

CONTINUOUS-TIME INPUT-STAGE SUCCESSIVE APPROXIMATION REGISTER ANALOG-TO-DIGITAL CONVERTER

RELATED APPLICATIONS

This is a United States National Phase Patent Application of International PCT Application Number PCT/US2020/017902, filed on Feb. 12, 2020, which claims priority to, and the benefit of, U.S. Provisional Application No. 62/893,065, filed Aug. 28, 2019, titled "Analog-to-Digital Converters (ADCs)", each of which is incorporated by reference herein in its entirety.

FIELD OF THE INVENTION

Embodiments described herein relate generally to an analog-to-digital converter (ADC) circuit, in particular, a low-power and small area successive approximation analog-to-digital converter circuit.

BACKGROUND

A successive approximation analog-to-digital converter (SAR ADC) circuit converts an input continuous analog waveform into a discrete digital representation by successively selecting quantized levels corresponding to binary output that converges a resulting reference to the input continuous analog waveform. Typical SAR ADC includes a front-end sampling circuit that acquires an input signal and a comparator that compares the input signal to an output of an internally referenced digital-to-analog converter. The output of the comparator is provided to a successive approximation register that generates an approximate digital code for the internally referenced digital-to-analog converter.

The front-end sampling circuit of a SAR ADC is typically designed with a large input capacitor to meet stringent linearity requirements for most ADC applications. At high-resolution, conventional SAR ADC tends to have large sampling capacitors that can consume significant amount of power as well as circuit area.

SUMMARY

The exemplified disclosure presents a successive approximation register (SAR) analog-to-digital converter (ADC) circuit that comprises a two-step (e.g., two-stage) analog-to-digital converter that operates a 1st-stage successive approximation register in the continuous time (CT) domain (also referred to as a "1-st stage CT-SAR") that then feeds a sampling operation located in the second stage. Without a front-end sampling circuit in the $1^{st}$-stage, the exemplary successive approximation analog-to-digital converter circuit can avoid high sampling noise associated with such sampling operation and thus can be configured with a substantially smaller input capacitor size (e.g., at least 20 times smaller) as compared to conventional Nyquist ADC with a front-end sample-and-hold circuit.

As discussed above, typical SAR ADC includes a front-end sampling circuit that acquires an input signal and a comparator that compares the input signal to an output of an internal reference digital-to-analog converter. The sampling circuit allows the internal reference digital-to-analog converter to converge so its output can be compared to the input signal. To operate the instant $1^{st}$ stage CT-SAR without a sampling operation, the instant $1^{st}$ stage CT-SAR is configured to perform input tracking and SAR quantization operation simultaneously across multiple SAR cycles. The CT-SAR operates on the CT input, via input AC coupling, and thus each SAR cycle sees a new input instantaneously so that the SAR delay error of each of the multiple SAR cycles performed does not accumulate across the multiple SAR cycles. The SAR conversion error may be further minimized by accelerating the SAR speed and providing redundancy. In some embodiments, a floating inverter-based (FIB) dynamic amplifier (DA) is used as an inter-stage amplifier located between the first and second stages to provide low-pass filtering for the $1^{st}$ stage residue.

In an aspect, an analog-to-digital converter (ADC) is disclosed comprising a first successive approximation register circuit configured to perform a plurality of successive continuous-time approximations of an input waveform to generate, at an output of the first successive approximation register circuit, a continuous-time residue signal and a first set of converted outputs; a sampling circuit coupled to the output of the first successive approximation register circuit to sample and hold the continuous-time residue signal after the successive continuous-time approximations; and a second successive approximation register circuit coupled to an output of the sampling circuit to perform a plurality of successive discrete-time approximations of the sampled residue signal to generate a second set of converted outputs, wherein the first set of converted outputs and the second set of converted outputs are used to generate an output of the analog-to-digital converter.

In some embodiments, the first successive approximation register circuit is configured to simultaneously perform input tracking and SAR quantization.

In some embodiments, the analog-to-digital converter further includes an inter-stage amplifier serially located between the output of the first successive approximation register and the sampling circuit, the inter-stage amplifier being configured as a low-pass filter (e.g., configured to filter wide-band thermal noise).

In some embodiments, the inter-stage amplifier is configured as a floating inverter-based (FIB) dynamic amplifier (DA) configured with a linear integration operation and a positive-feedback regeneration operation.

In some embodiments, the inter-stage amplifier comprises a filter circuit and a gain amplifier circuit.

In some embodiments, the second successive approximation register circuit comprises redundancy of the first successive approximation register circuit (e.g., wherein the second successive approximation register circuit is configured to perform the plurality of successive discrete-time approximations of the sampled residue signal with redundancy that includes a plurality of successive discrete-time approximations of the input waveform as performed by the first successive approximation register circuit), the analog-to-digital converter further comprising a summing circuit coupled to the first successive approximation register circuit and the second successive approximation register circuit, wherein the summing circuit is configured to perform a weighted sum operation of at least a portion the first set of converted outputs and at least a portion of the second set of converted outputs.

In some embodiments, the first successive approximation register circuit and the second successive approximation register circuit are capacitively-coupled.

In some embodiments, the analog-to-digital converter are implemented, in part, using at least one of CMOS, NMOS, PMOS process.\

In some embodiments, the ADC is configured as at least one of an 8-bit ADC, a 9-bit ADC, a 10-bit ADC, a 11-bit ADC, a 12-bit ADC, a 13-bit ADC, a 14-bit ADC, a 15-bit ADC, a 16-bit ADC, a 17-bit ADC, a 18-bit ADC, a 19-bit ADC, a 20-bit ADC, a 21-bit ADC, a 22-bit ADC, a 23-bit ADC, and a 24-bit ADC.

In some embodiments, the first successive approximation register circuit comprises an input capacitor, the input capacitor having a capacitance less than 120 fF for a 13-bit conversion.

In some embodiments, the first successive approximation register circuit comprises an input capacitor, the input capacitor being sub-pico-Farad.

In some embodiments, the first successive approximation register circuit forms a CT-SAR based 1st-stage that does not include a sample-and-hold circuit.

In some embodiments, the first successive approximation register circuit is configured to perform a single-bit comparison, a single-bit DAC, and a subtraction operation for each respective CT-SAR cycle.

In another aspect, a method is disclosed of converting an input analog signal to an output digital signal representing the input analog signal, the method comprising: successively approximating, via a circuit, over a first set of plurality of approximations, a residue signal of the input analog signal to determine a first set of converted outputs of the digital signal, wherein at each first set of plurality of approximations one or more additional converted outputs of the first set of converted outputs are determined and an aggregated set of the generated first set of converted outputs bits (e.g., LSB binary outputs) is used to generate a signal that is combined to the input analog signal; sampling, via the circuit, the residual signal after the plurality of approximations the residue signal; successively approximating, via the circuit, over a second set of plurality of approximations, the sampled residue signal to determine a second set of converted outputs of the digital signal (e.g., MSB binary outputs); combining, via the circuit, the first set of converted outputs and the second set of converted outputs to generate the output digital signal representing the input analog signal; and outputting, via the circuit, the output digital signal.

In some embodiments, the steps are performed within a single ADC conversion cycle.

In some embodiments, the method further includes simultaneously performing both input tracking and SAR quantization over the first set of plurality of approximations as a part of the step to successively approximating the residue signal of the input analog signal.

In some embodiments, the step of simultaneously performing both input tracking comprises adding, via the circuit, at each of the first set of plurality of approximations after a first approximation, the successively approximated residue signal of the input analog signal to the input signal analog signal while allowing the input analog signal to float.

In some embodiments, the method further includes performing, via the circuit, a low-pass operation prior to the sampling step and after the successively approximating step to generate the residue signal.

In some embodiments, the method further includes performing, via the circuit, a low-pass and gain operation prior to the sampling step and after the successively approximating step to generate the residue signal.

In some embodiments, wherein the step of successively approximating the sampled residue signal to determine a second set of converted outputs comprises redundancy of the first successive approximation operation, the method further comprising: performing, via the circuit, a weighted sum operation of at least a portion the first set of converted outputs and at least a portion of the second set of converted outputs.

BRIEF DESCRIPTION OF DRAWINGS

Embodiments of the present invention may be better understood from the following detailed description when read in conjunction with the accompanying drawings. Such embodiments, which are for illustrative purposes only, depict novel and non-obvious aspects of the invention. The drawings include the following figures:

FIGS. 4A, 4B, 4C, and 4D are diagrams illustrating conversion errors associated with CT SAR in accordance with an illustrative embodiment.

FIGS. 11A and 11B show stimulated gain $g_m$ and simulated frequency response of the floating inverter-based (FIB) dynamic amplifier of FIG. 10A in accordance with an illustrative embodiment.

FIG. 12 shows a photograph of a fabricated die of the CT/DT SAR ADC device of FIG. 8A in a 40-nm LP-CMOS process in accordance with an illustrative embodiment.

SPECIFICATION

Figure 1:
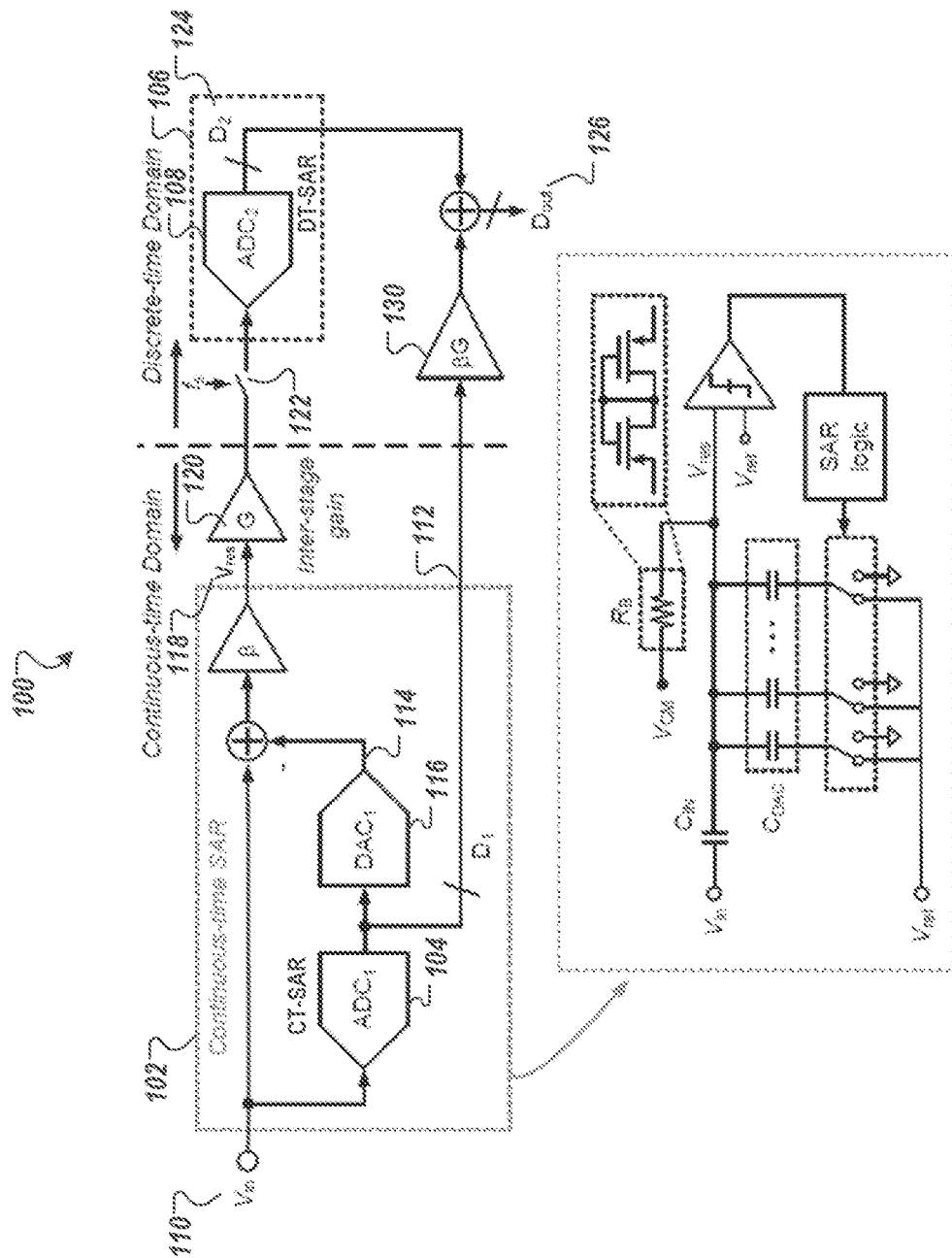
FIG. 1 shows an exemplary multi-stage continuous-time and discrete-time successive approximation register analog-to-digital converter (CT/DT SAR ADC) device in accordance with an illustrative embodiment.

Each and every feature described herein, and each and every combination of two or more of such features, is included within the scope of the present invention provided that the features included in such a combination are not mutually inconsistent.

In some aspects, the disclosed technology relates to capacitance-to-digital converter circuits and operations. Although example embodiments of the disclosed technology are explained in detail herein, it is to be understood that other embodiments are contemplated. Accordingly, it is not intended that the disclosed technology be limited in its scope to the details of construction and arrangement of components set forth in the following description or illustrated in the drawings. The disclosed technology is capable of other embodiments and of being practiced or carried out in various ways.

It must also be noted that, as used in the specification and the appended claims, the singular forms "a," "an" and "the" include plural referents unless the context clearly dictates otherwise. Ranges may be expressed herein as from "about" or "approximately" one particular value and/or to "about" or "approximately" another particular value. When such a range is expressed, other exemplary embodiments include from the one particular value and/or to the other particular value.

By "comprising" or "containing" or "including" is meant that at least the named compound, element, particle, or method step is present in the composition or article or method, but does not exclude the presence of other compounds, materials, particles, method steps, even if the other such compounds, material, particles, method steps have the same function as what is named.

In describing example embodiments, terminology will be resorted to for the sake of clarity. It is intended that each term contemplates its broadest meaning as understood by those skilled in the art and includes all technical equivalents that operate in a similar manner to accomplish a similar purpose. It is also to be understood that the mention of one or more steps of a method does not preclude the presence of additional method steps or intervening method steps between those steps expressly identified. Steps of a method may be performed in a different order than those described herein without departing from the scope of the disclosed technology. Similarly, it is also to be understood that the mention of one or more components in a device or system does not preclude the presence of additional components or intervening components between those components expressly identified.

Some references, which may include various patents, patent applications, and publications, are cited in a reference list and discussed in the disclosure provided herein. The citation and/or discussion of such references is provided merely to clarify the description of the disclosed technology and is not an admission that any such reference is "prior art" to any aspects of the disclosed technology described herein. In terms of notation, "[n]" corresponds to the nth reference in the list. For example, [1] refers to the first reference in the list, namely P. P. Harpe et al., "11.1 An oversampled 12/14b SAR ADC with noise reduction and linearity enhancements achieving up to 79.1 dB SNDR," in 2014 IEEE International Solid-State Circuits Conference Digest of Technical Papers (ISSCC), pp. 194-195, February 2014. All references cited and discussed in this specification are incorporated herein by reference in their entireties and to the same extent as if each reference was individually incorporated by reference.

In the following description, references are made to the accompanying drawings that form a part hereof and that show, by way of illustration, specific embodiments or examples. In referring to the drawings, like numerals represent like elements throughout the several figures.

Example System

FIG. 1 shows an exemplary multi-stage continuous-time and discrete-time successive approximation register analog-to-digital converter (CT/DT SAR ADC) device 100 in accordance with an illustrative embodiment. In FIG. 1, the exemplary CT/DT SAR ADC device 100 includes a first-stage continuous-time successive approximation register circuit portion 102 (shown comprising a "CT-SAR" 104, also referred to as "$ADC_1$" 104) and a second-stage discrete-time successive approximation register circuit portion 106 (shown comprising a "DT-SAR" 108, also referred to as "$ADC_2$" 108).

The first-stage continuous-time successive approximation register circuit portion 102 (also referred to herein as a "$1^{st}$ stage CT SAR circuit portion 102" and "$1^{st}$ stage CT SAR") is configured to perform a plurality of successive continuous-time approximations over a plurality of SAR cycles of an input waveform 110 (shown as "$V_{in}$," 110) to generate a set of converted outputs 112 (shown as "$D_1$," 112) corresponding to the AC-component of the input waveform 110. The 1st-stage CT SAR circuit portion 102 allows the input waveform 110 to float and generates a continuous-time residue signal 118 (shown as "$V_{res}$," 118) by combining the input waveform 110 with a digital-to-analog conversion output 114 (shown being generated by "$DAC_1$," 116) of the converted outputs 112 as they are being generated. At the last SAR cycle of the $1^{st}$-stage CT SAR circuit operation, the continuous-time residue signal 118 is amplified (via an amplifier 120 having a gain "G") and then sampled (via a sampling circuit 122 shown as a sample-and-hold switch 122 having a sampling frequency "$f_s$") and then used by the 2nd-stage DT SAR circuit portion 106, over a second set of SAR cycles, to generate a second set of converted outputs 124. The first and second set of converted outputs (112 and 124) are then combined to generate the final ADC outputs 126 that represent the input waveform 110.

Because the CT/DT SAR ADC device 100 pre-generates a portion (e.g. 112) of a digital representation of the input waveform prior to the input waveform being sampled (i.e., the $1^{st}$ CT SAR circuit portion 102 does not include a sampling circuit) to generate the residue signal (e.g., 118)

that is then amplified prior to it being sampled-and-hold, the sampling noise associated with the $2^{nd}$ stage DT SAR (e.g., 106) is small relative of the input signal (and notably, smaller than sampling noise associated with conventional Nyquist ADC). As noted above, without a front-end sampling circuit in the $1^{st}$ stage, the exemplary CT/DT SAR ADC device 100 can be configured with a substantially smaller input capacitor size (e.g., at least 20 times smaller) as compared to conventional Nyquist ADC with a front-end sample-and-hold circuit. Because input capacitance contributes a substantial portion of size and power consumption in conventional Nyquist ADC, the exemplary CT/DT SAR ADC device 100 has substantially lower power consumption and circuit size. Experimental results, later discussed herein, show that the exemplary CT/DT SAR ADC device 100 can operate at 2 MS/s with 72-dB SNDR at the Nyquist rate while consuming only 25 µW of power and 0.01 mm² of area.

Referring still to FIG. 1, the exemplary CT/DT SAR ADC device 100 includes the sampling circuit 122 situated between the $1^{st}$ stage CT SAR circuit portion 102 and the $2^{nd}$ stage DT SAR circuit portion 106. The sampling circuit (e.g., 122) receives the continuous-time residue signal (e.g., 118), or a signal derived therefrom, from the $1^{st}$ CT SAR circuit portion 102 and is configured to sample (and hold) to convert the amplitude level of the continuous-time residue signal (e.g., 118) into the discrete-time domain for the 2nd-stage DT SAR circuit portion 106.

To further reduce the size of the input capacitors, in some embodiments, and as shown in FIG. 1, the exemplary CT/DT SAR ADC device 100 includes the amplifier 120 that is located before the sampling circuit 116. The sampling circuit 116 receives the output of the inter-stage amplifier 118 and converts the continuous-time residue signal 118 into the DT domain for the 2nd-stage DT SAR circuit portion 106. Because the sampling circuit 122 is located after the gain operation (e.g., amplifier 120), the associated sampling noise generated by the sampling circuit 122 is not amplified (as noted above) by the gain operation and is made lower in referenced to the amplified signal. To this end, substantially smaller capacitors (typically used in conventional SAR ADCs to address such sampling noise) may be used.

In FIG. 1, the $2^{nd}$ stage DT SAR circuit portion 106 receives the sampled-and-hold output of the sampling circuit 122 and performs a plurality of successive discrete-time approximations of the sampled residue signal to generate a second set of converted outputs 124 (shown as "D₂" 124). The first set of converted outputs 112 and the second set of converted outputs 124 are both used to generate a final ADC output 126 (shown as "$D_{out}$" 126) of the exemplary CT SAR ADC device 100. In some embodiments, the final ADC output 126 is the weighted sum of digital outputs (e.g., 112, 124) from the 1st-stage CT SAR (102) and the 2nd-stage DT DAR (106). In FIG. 1, the final AC output 126 is shown as a sum of the first digital output (weighted by a gain of "βG" 130).

In some embodiments, and as shown in FIG. 1, the amplifier 120 is configured as an inter-stage amplifier to amplify the continuous-time residue signal 108 of the first successive approximation register circuit portion 102 and to filter, via a low-pass filtering, wide-band thermal noise associated with the circuit. In some embodiments, a distinct, separate low-pass circuit is implemented before the inter-stage amplifier 120 or between the inter-stage amplifier 120 and the sampling circuit 122.

Indeed, as noted above, without a front-end sampling circuit in the $1^{st}$-stage, the exemplary successive approximation analog-to-digital converter circuit 100 can avoid high sampling noise associated with such sampling operation and thus can be configured with a substantially smaller input capacitor size (e.g., at least 20 times smaller) as compared to conventional Nyquist ADC with a front-end sample-and-hold circuit.

Method of Operation

Figure 2:
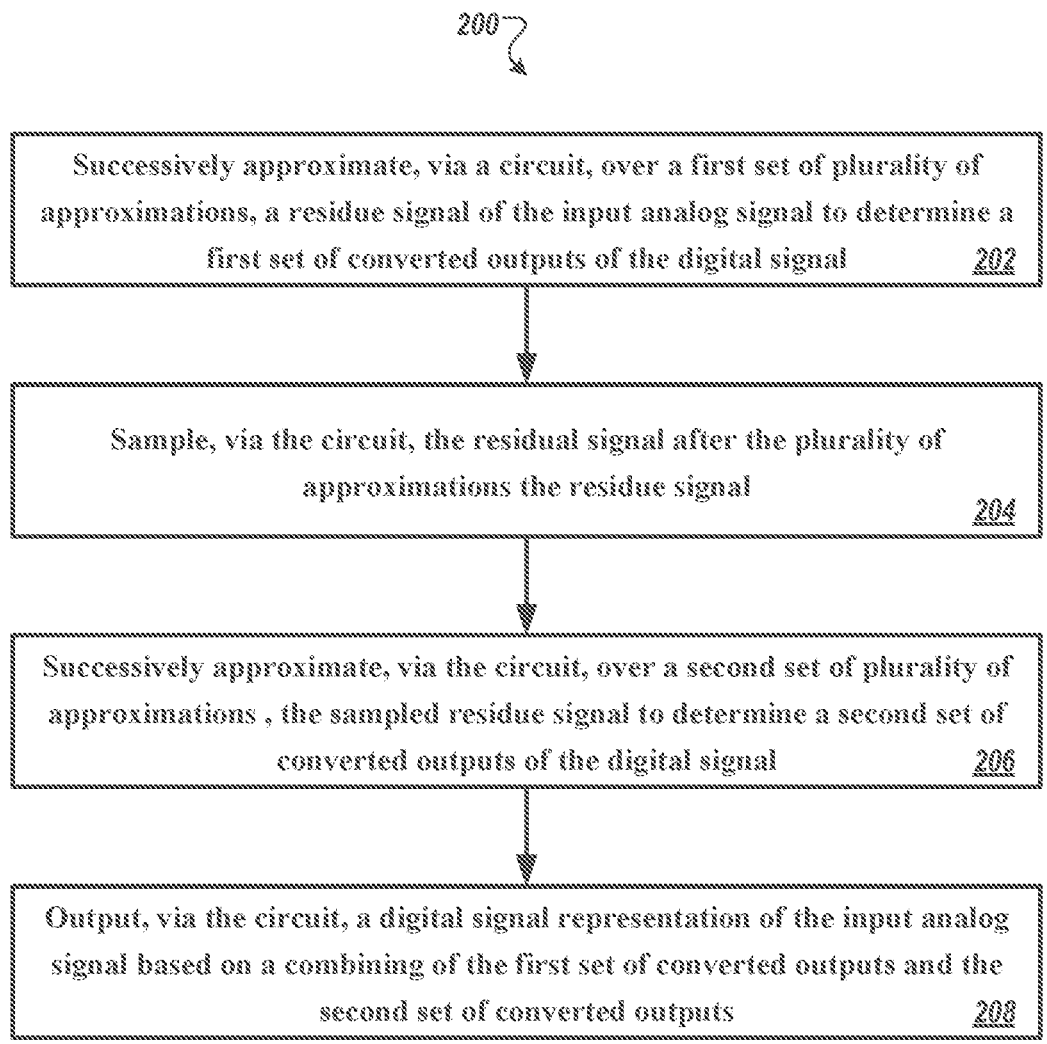
FIG. 2 shows a method to perform a first-stage continuous-time successive approximation and second-stage discrete-time successive approximation to convert an input analog signal to an output digital signal representing the input analog signal in accordance with an illustrative embodiment.

FIG. 2 shows a method 200 to perform a first-stage continuous-time successive approximation and a second-stage discrete-time successive approximation to convert an input analog signal to an output digital signal representing the input analog signal in accordance with an illustrative embodiment.

As shown in FIG. 2, the method 200 includes successively approximating (step 202), via a circuit (e.g., 102), over a first set of plurality of approximations, a residue signal (e.g., 118) of the input analog signal (e.g., 110) to determine a first set of converted outputs (e.g., 112) of the digital signal. At each operation (202) of the first set of plurality of approximations, one or more additional converted outputs (e.g., 112) of the first set of converted outputs are determined and an aggregated set of the generated first set of converted outputs bits (e.g., LSB binary outputs) is used to generate a signal (e.g., associated with 114) that is combined to the input analog signal (e.g. 110) to generate the residue signal 118.

Figure 3A:
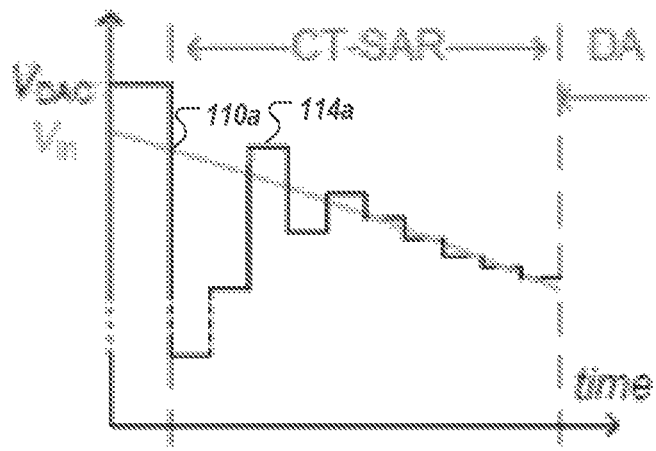
FIGS. 3A, 3B, and 3C show various aspects of an example operation of the $1^{st}$ stage CT SAR circuit portion of FIG. 1 to successively approximate a residue signal and the first set of converted outputs of FIG. 2 in accordance with an illustrative embodiment.
Figure 3B:
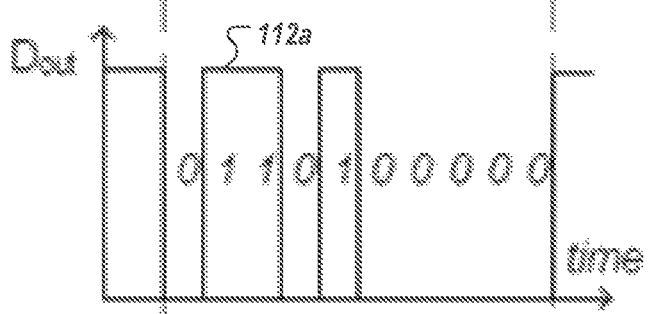
Figure 3C:
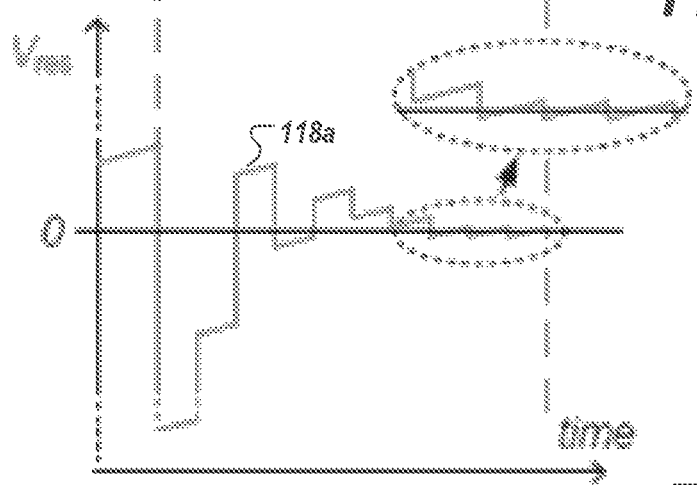

FIGS. 3A, 3B, and 3C show various aspects of an example operation of the $1^{st}$ stage CT SAR circuit portion 102 of FIG. 1 to successively approximate a residue signal and the first set of converted outputs of FIG. 2 in accordance with an illustrative embodiment. FIG. 3A shows DAC output 114 (shown as "$V_{DAC}$" 114a) of the $1^{st}$ stage CT SAR circuit portion 102 with respect to an example input waveform "$V_{in}$" 110 (shown as 110a). Because the input waveform is allowed to float, FIG. 3A illustrates the input waveform 110a as varying. FIG. 3B shows corresponding converted outputs 112 (shown as "$D_{out}$" 112a) generated by the continuous-time successive approximation. FIG. 3C shows corresponding continuous-time residue signal 118 (shown as "$V_{res}$" 118a). Indeed, the continuous-time residue signal 118a is merely a difference signal between the input waveform "$V_{in}$" 110a and the DAC output "$V_{DAC}$" 114a. The operation of the $1^{st}$ stage CT SAR circuit portion 102 is performed for a number SAR cycles to produce the continuous-time residue signal 118a which is successively getting smaller with each iteration.

Referring back to FIG. 2, the method 200 includes the step of sampling (step 204), via the circuit (e.g., 100), the residual signal (e.g., 106) after the plurality of approximation operations by the $1^{st}$ stage CT SAR circuit portion 102.

Referring still to FIG. 2, the method 200 includes successively approximating (step 206), via the circuit (e.g., 106), over a second set of plurality of approximations, the sampled residue signal (e.g., 118) to determine a second set of converted outputs (e.g., 124) of the digital signal (e.g., MSB binary outputs).

Referring still to FIGS. 2, the method 200 includes outputting (step 208), via the circuit (e.g., 100), the output digital signal (e.g., 126). In some embodiments, the output digital signal (e.g., 126) is generated by combining, via the circuit (e.g., 100), the first set of converted outputs (e.g., 112) and the second set of converted outputs (e.g., 124). As discussed above, in some embodiments, the first set of converted outputs (e.g., 112) and the second set of converted outputs (e.g., 124) are combined with a weighted sum operation.

CT SAR Conversion Error and Mitigation

To reduce the CT SAR error, the time ($T_{SAR}$) for each SAR operation by the 1$^{st}$ CT SAR circuit portion 102 is minimized and redundancy may be introduced in the 2$^{nd}$ stage DT SAR circuit portion 106.

Conversion Time $T_{SAR}$ Minimization. Unlike a conventional DT SAR, the input (e.g., 110) of the 1$^{st}$ stage CT SAR circuit portion (e.g., 102) can vary with time during each CT SAR conversion process. This change in the input waveform (e.g., 110) can cause conversion error as system conversion time progresses. FIGS. 4A, 4B, 4C, and 4D are diagrams illustrating conversion errors associated with CT SAR in accordance with an illustrative embodiment.

FIG. 4A shows a baseline error for a conventional DT SAR. As shown in FIG. 4A, in DT SAR, the DAC output is compared to a sampled input ($V_{in}$) (402), which does not change during the SAR conversion. Because a sampled input does not change during the SAR conversion process, the sampled input can be precisely converted regardless of how different the real-time input deviates from the sampled one. The conversion error is thus primarily the result of quantization error as well as circuit nonidealities (e.g., capacitor mismatch, comparator noise, DAC settling error, etc.). The sample-and-hold (S/H) circuit in essence isolates the CT input from the SAR conversion process.

In contrast, without the S/H circuit, the exemplary 1$^{st}$ stage CT SAR circuit portion (e.g., 102) is fully exposed to the CT input (404), whose variation can cause large errors because the SAR conversion process no longer has a consistent convergence target.

FIG. 4B shows an example scenario in which an input signal (406) is rising at a rate that is slightly below the decision threshold of the MSB comparison. As shown in FIG. 4B, the comparator outputs a '0' and directs a set of binary searches that is below the MSB decision threshold. Indeed, the input signal (406) is shown in this scenario to rise at a rate that is above the MSB threshold. To this end, as shown in FIG. 4B, the DAC output (408) fails to track the time-varying input, which leads to a large conversion error. The conversion residue $V_{res}$ (as the conversion error in the 1st stage CT SAR circuit portion 102) can be considered as having two components as provide in Equation 1.

$$V_{res} = E_q + E_{slope} \quad \text{(Equation 1)}$$

In Equation 1, $E_q$ represents the quantization error, which is the same as in the DT SAR. $E_{slope}$ represents the additional error caused by the input variation (e.g., as found in the 1$^{st}$ stage CT SAR circuit portion (102)). $E_{slope}$ can occur when the CT input crosses a particular decision threshold and moves in the opposite direction with the subsequent binary search. Such threshold crossing happens at the (N−k+1)-th comparison (where N is the total number of SAR comparisons), and $E_{slope}$ can be approximated by the input signal variation from the (N−k+1)-th comparison to the end of the LSB comparison as provided in Equation 2.

$$E_{slope} \approx |\Delta V_{in}| \le k \cdot T_{SAR} \cdot A \cdot 2\pi \cdot f_{in} \quad \text{(Equation 2)}$$

In Equation 2, $T_{SAR}$ represents a single SAR cycle time, and A and $f_{in}$ are the input signal amplitude and frequency, respectively. Per Equation 2, the worst case $E_{slope}$ can occur at the MSB decision with k=N because $V_{in}$ has the longest time to drift away from the critical decision threshold. To minimize $E_{slope}$, in some embodiments, the instant 1$^{st}$ stage CT SAR circuit portion (e.g. 102) is configured to reduce N, but this would reduce the CT SAR resolution, leading to increased $E_q$. FIG. 4C shows how reducing $T_{SAR}$ as, for example, performed in an exemplary 1$^{st}$ stage CT SAR circuit portion 102, can reduce $E_{slope}$. To this end, dynamic logic [2], [5] and asynchronous clocking [16] can be used. CMOS scaling also helps as it naturally decreases $T_{SAR}$.

Figure 5:
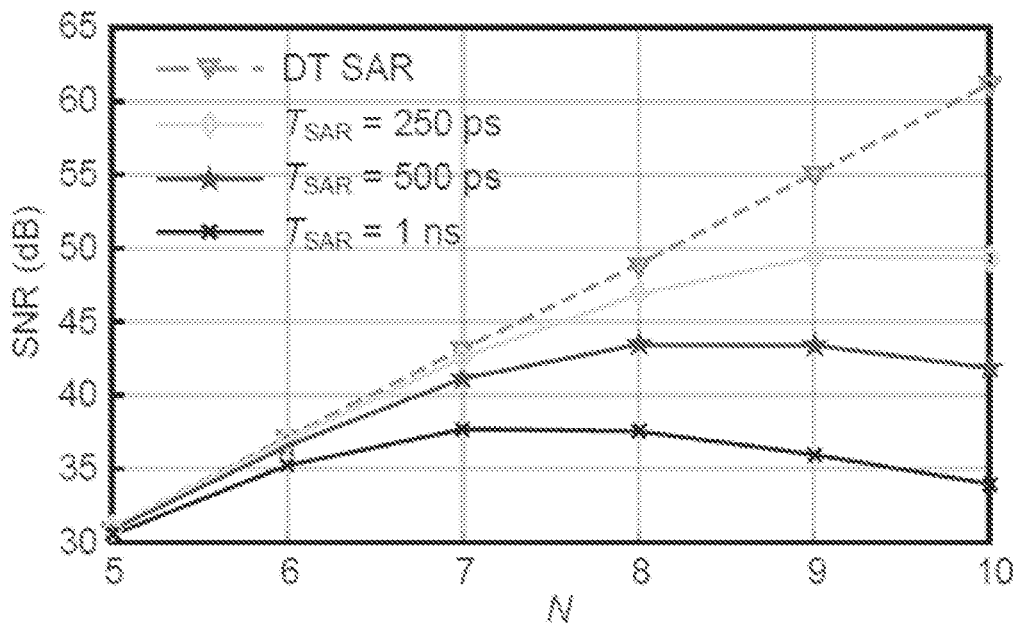
FIG. 5 shows a plot the simulated SNR degradation performance across different conversion cycles (N) for the $1^{st}$ stage CT SAR circuit portion in accordance with an illustrative embodiment.

FIG. 5 shows a plot of simulated SNR degradation performance across different conversion cycles (N) for the 1$^{st}$ stage CT SAR circuit portion (e.g., 102) in accordance with an illustrative embodiment. In FIG. 5, a full-swing 1-MHz input is assumed. Per FIG. 5, SNR is defined as the signal power divided by the power of the conversion residue $V_{res}$ at the end of the LSB comparison.

Per FIG. 5, when N is small, SNR is limited by $E_q$. As N increases, $E_q$ decreases exponentially, and the SNR starts to be limited by $E_{slope}$. And, when N is very large, the SNR decreases because $E_{slope}$ increases with N as indicated in Equation 2. To this end, as shown in FIG. 5, shortening $T_{SAR}$ (e.g., via $T_{SAR}$=250 ps) can reduce $E_{slope}$ and increase SNR. Because, in the 40 nm CMOS process, $T_{SAR}$ is limited to about 200 ps, more advanced process may be beneficial to further reduce $T_{SAR}$.

Redundancy to Mitigate Conversion Error. To further suppress $E_{slope}$, redundancy can be added in the SAR DAC [25]—[27]. Because the input signal variation can be considered as incorrect conversion results in the prior MSB decisions, redundancy can be added so long as the redundancy is greater than $E_{slope}$ as specified in Equation 2. Indeed, with redundancy, the DAC output response can catch up to and track the time-varying input, as shown in FIG. 4D.

In Equation 2, $E_{slope}$ is larger for the MSB bits and smaller for the LSB bits. Thus, more redundancy should be allocated for the MSB bit (k=N), while less redundancy is needed for the LSB bit (k=1). To this end, redundancy may be optimally configured in accordance with Equation 2 in which the CDAC bit weight $\{W_k\}$ are assigned per Equation 3 to support a Nyquist-rate input. In Equation 3, B represents an effective number of bit of the CDAC.

$$W_k = \begin{cases} 1 & \text{for } k = 1 \\ \sum_{i=1}^{k-1} W_i - 2^{B-1} \cdot k \cdot T_{SAR} \cdot 2\pi \cdot f_{in,Nyq} & \text{for } k > 1 \end{cases} \quad \text{(Equation 3)}$$

Figure 6:
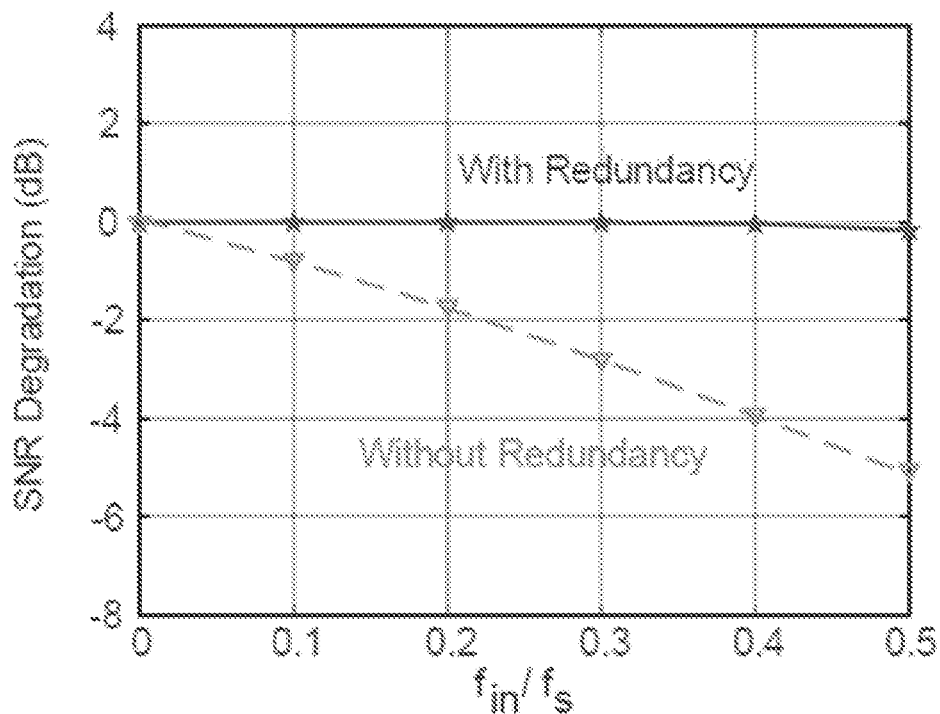
FIG. 6 shows a plot of simulated SNR degradation for a device in which redundancy and no redundancy are implemented in accordance with an illustrative embodiment.

FIG. 6 shows simulated SNR degradation for a device in which redundancy and no redundancy are implemented in accordance with an illustrative embodiment. In FIG. 6, $T_{SAR}$=500 ps is assumed, and the ADC sampling rate $f_s$=2 MHz and B=7. The SNR degradation generally refers to the SNR difference between the 1$^{st}$ stage CT SAR and its corresponding DT SAR. As shown in FIG. 6, without redundancy, there is appreciable SNR degradation as the input signal frequency increases. In contrast, also per FIG. 6, with redundancy embedded, almost no SNR degradation is observed over the entire Nyquist band.

Inter-Stage Amplifier Operation with a Time-Varying $V_{res}$

FIGS. 7A, 7B, 7C, 7D, and 7E show various aspects of analysis of an inter-stage dynamic amplifier (DA) that may be implemented in the exemplary CT/DT SAR ADC device (e.g. 100, 100a) in accordance with an illustrative embodiment.

Figure 7A:
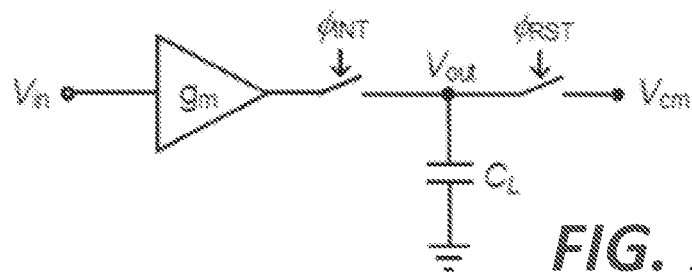
FIGS. 7A, 7B, 7C, 7D, and 7E show various aspects of analysis of an inter-stage dynamic amplifier (DA) that may be implemented in the exemplary CT/DT SAR ADC device in accordance with an illustrative embodiment.

FIG. 7A shows a simplified circuit model to analyze the operation of a dynamic amplifier having a time-varying input. As shown in FIG. 7A, during a reset phase, the output $C_L$ is shorted to a common-mode voltage. During the amplification phase, the DA works as a transconductor $g_m$ that integrates the input onto $C_L$ with the fixed time window $T_{int}$ in which the DA output $V_{out}$ can be expressed in Equation 4.

$$V_{out}[n] = \int_{nT_0}^{nT_0+T_{int}} \frac{g_m \cdot V_{in}(t)}{C_L} \cdot dt \quad \text{(Equation 4)}$$

$$= \frac{g_m}{C_L} \cdot V_{in}(t) \otimes h(t) \mid_{t=nT_0+T_{int}} \quad \text{(Equation 4.1)}$$

Figure 7B:
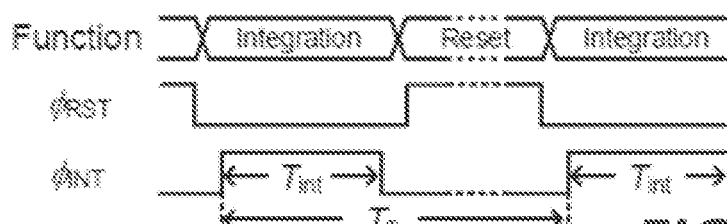
Figure 7C:
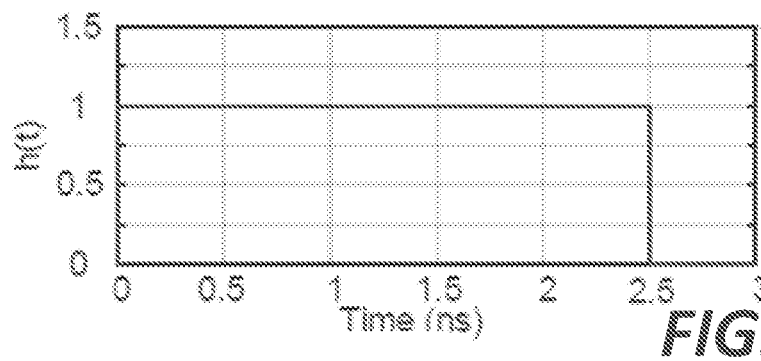

In Equation 4.1, which is a reduction of Equation 4, $V_{out}(n)$ is the output after the n-th integration, $T_0$ is the total time period consisting of both the reset and the integration phases (as shown in FIG. 7B). In Equations 4 and 4.1, the integration process is shown to be equivalent to a convolution with a window function h(t) (as shown in FIG. 7C), and then sampled at $t=nT_0$. Thus, the overall transfer function of the DA is equivalent to a sinc function as provided in Equation 5.

$$H(\omega) = \frac{g_m \cdot T_{int}}{C_L} \cdot \text{sinc}\left(\omega \cdot \frac{T_{int}}{2}\right) \cdot e^{j\omega \cdot \frac{T_{int}}{2}} \quad \text{(Equation 5)}$$

Figure 7D:
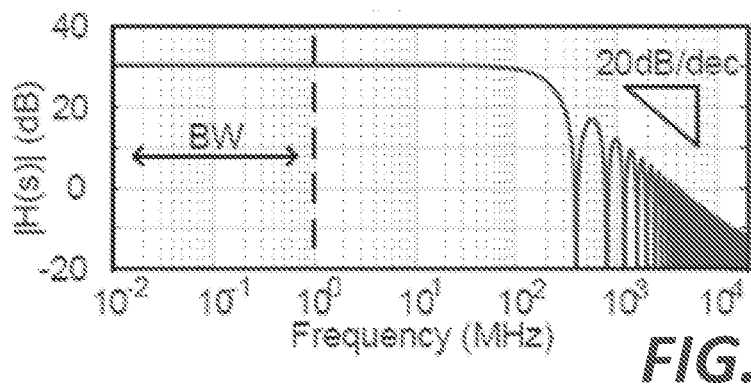

FIG. 7D shows a plot of an example magnitude response with $T_{int}=2:5$ ns and a nominal DC gain of 30 dB. Within the signal bandwidth of 1 MHz, the DA works like a normal amplifier with a fixed gain. At out-of-band high frequencies, the DA has a low-pass response due to its integration behavior. As a result, it can provide inherent 1st-order anti-aliasing capability. This low-pass response may be used to filter wideband thermal noise before the DA, leading to the significantly reduced sampling kT/C noise for the 1st stage CT SAR.

Figure 7E:
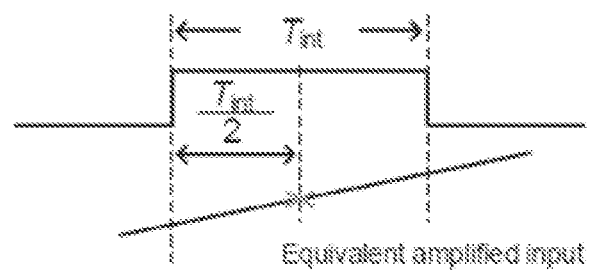

FIG. 7E shows a simplified time domain view of the DA with a ramp-like input. The DA is equivalent to amplify a sampled middle point (or the time-average point) of the input. From this viewpoint, it can be observed that the DA operation with a time-varying input can be mapped to a sampled input case.

Example Implementation of 13-Bit CT/DT SAR ADC

Figure 8A:
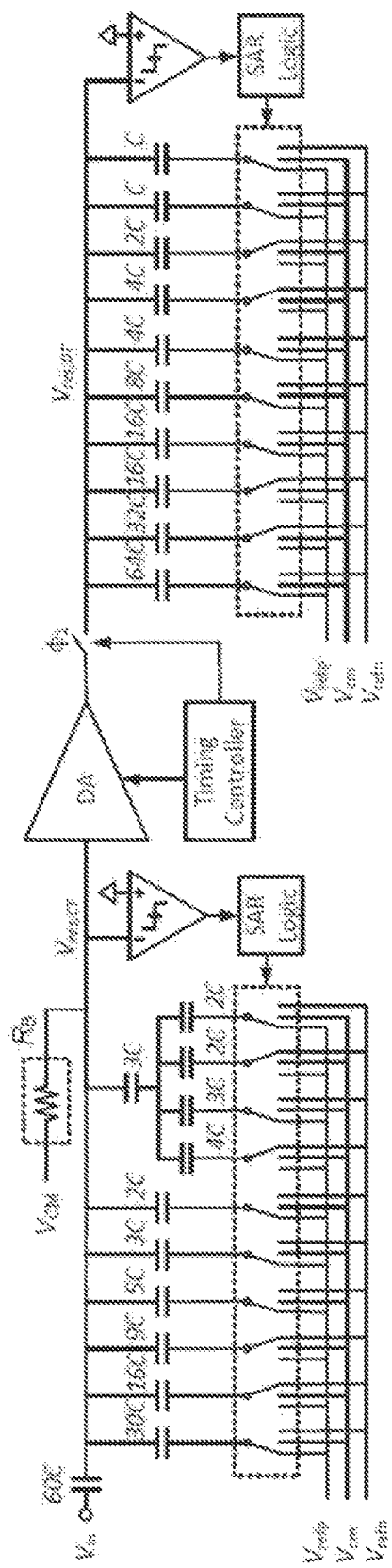
FIG. 8A shows schematics of an exemplary 13-bit CT/DT SAR ADC device in accordance with an illustrative embodiment.
Figure 8B:
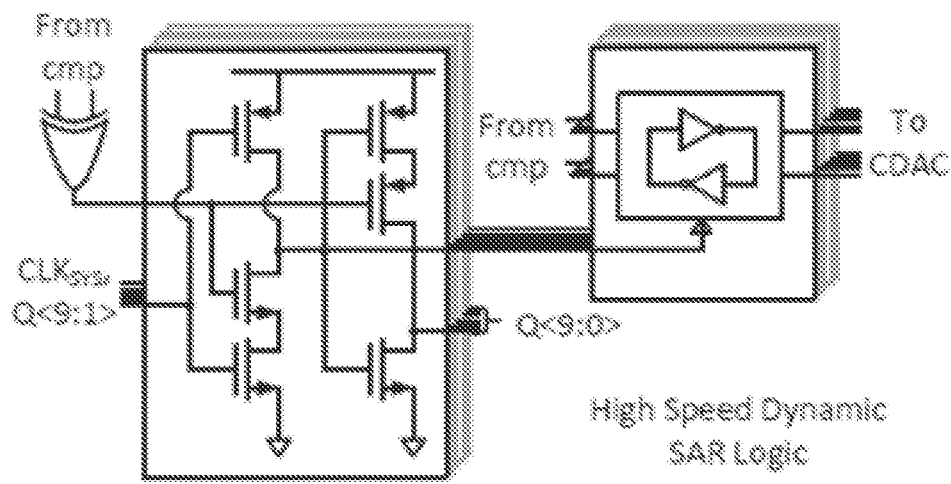
FIGS. 8B and 8C show various aspects of operations of the exemplary 13-bit CT/DT SAR ADC device of FIG. 8A in accordance with an illustrative embodiment.
Figure 8C:
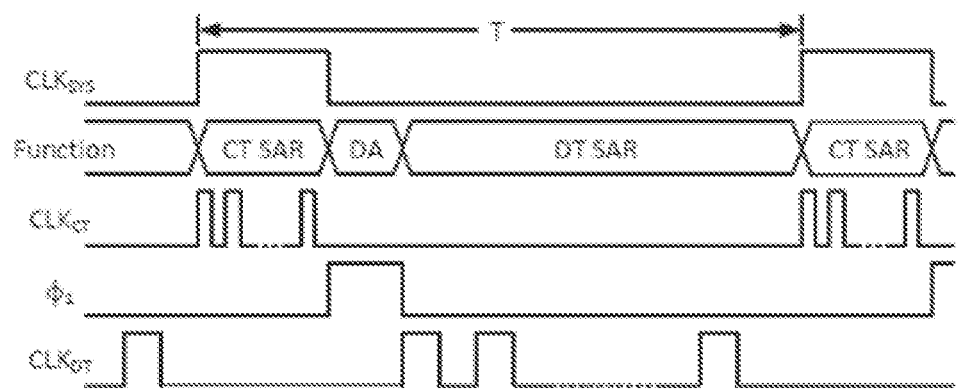

FIGS. 8A, 8B, and 8C show schematics of various aspects and operations of an exemplary 13-bit CT/DT SAR ADC device 100 (shown as 100a) in accordance with an illustrative embodiment. The exemplary CT/DT SAR ADC device 100a is configured as a 2-MS/s ADC designed in a 40 nm CMOS process. For simplicity, only a single-ended configuration is shown, but a fully differential design can be readily prepared as would be understood by a person skilled in the art.

As shown in FIG. 8A, in the 1st stage CT SAR circuit portion (e.g., 102), the target effective number of bits B is 7 to minimize the amplitude of $V_{res}$ while relaxing the linearity requirement of the inter-stage amplifier. The total number of comparisons N of the 1$^{st}$ stage CT SAR circuit portion is 10 to allocate sufficient redundancy to tolerate input signal variation and capacitor mismatch. The unit capacitor C is 1 fF. An example bridge capacitor network is used to implement lower LSB capacitors. The device 100a is configured with an input capacitor and the total CDAC capacitor having 60 fF and 68 fF, respectively, to balance the trade-off among the ADC input signal swing, the attenuation factor, the chip area, and the ADC input and reference buffer requirement. The values may be adjusted accordingly for such considerations.

Because the raw matching of the small capacitors may not meet the requirement of a target 13-bit resolution, a one-time foreground capacitor mismatch calibration may be applied in some embodiments as in [16], [28]. The size of the pseudo-resistor $R_B$ is chosen such that the high-pass corner frequency is around 50 Hz. The device 100a is configured with a $T_{SAR}$ of 500 ps.

FIG. 8B shows a schematic of a high-speed dynamic SAR logic configured with shorten $T_{SAR}$ in accordance with an illustrative embodiment. Further description of example high-speed dynamic SAR logic is provided in P. Harpe, C. Zhou, X. Wang, G. Dolmans, and H. de Groot, "A 30 fJ/conversion-step 8b 0-to-10 MS/s asynchronous SAR ADC in 90 nm CMOS," in 2010 IEEE International Solid-State Circuits Conference—(ISSCC), pp. 388-389, February 2010, which is incorporated by reference herein in its entirety.

FIG. 8C shows an ADC timing diagram of the CT/DT SAR ADC device 100a of FIG. 8A in accordance with an illustrative embodiment. As shown in FIG. 8C, the 1st-stage CT-SAR is triggered at a rising edge of the system clock $CLK_{SYS}$ and runs asynchronously for 10 cycles. In total, the 1st-stage SAR is performed for about 5 ns. Notably, even though the SAR speed is much faster than the Nyquist rate, it is observed that the power increase from such high-speed operation can have negligible impact to the overall power budget design. In the 40-nm CMOS process, to meet the speed requirement, the transistor size for the logic gates and the comparators are kept small; to this end, the increase in the comparator power and SAR logic power can be negligible.

Referring still to FIG. 8C, the dynamic amplifier (DA) (e.g., 120) is triggered by the falling edge of $CLK_{SYS}$ and is performed over 2.5 ns to achieve a gain of 32. $T_{SAR}$ may be affected by fabrication processes, voltage, and temperature (PVT) variations, among other factors. Indeed, if there is a large time difference, for example, between the end of 1st-stage SAR cycles and the DA start time (i.e., the falling edge of $CLK_{SYS}$), it may increase the amplitude of the 1st-stage conversion residue (e.g. 118). In some embodiments, to mitigate such variations, $T_{SAR}$ is adjusted via tunable delay cells in the foreground to minimize the time difference.

Figure 9:
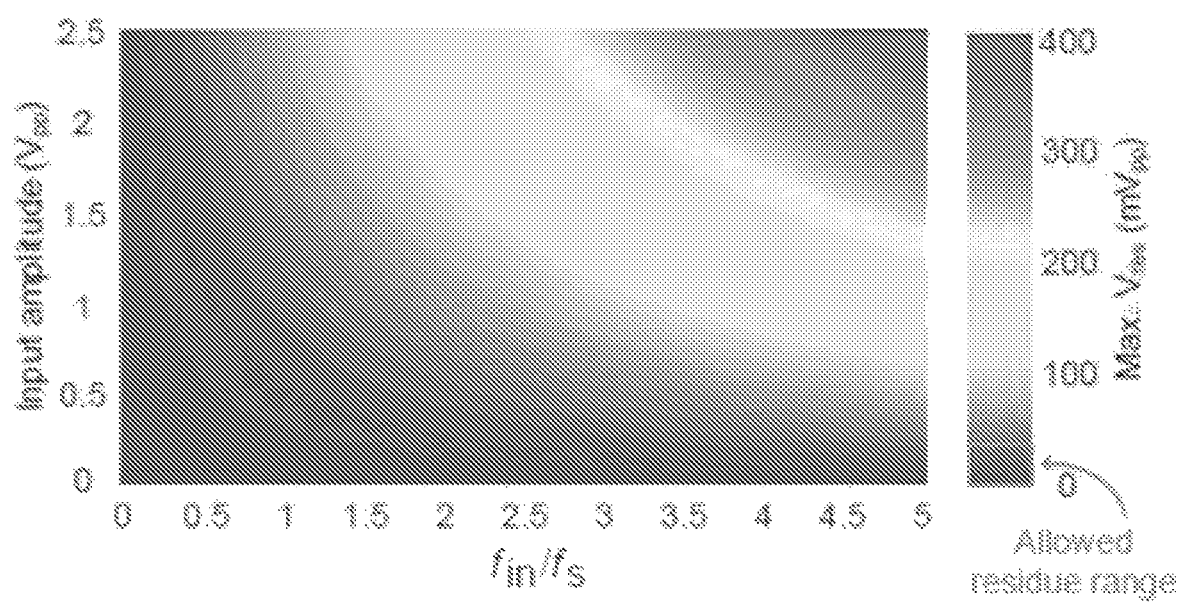
FIG. 9 shows a simulated operating band of the CT/DT SAR ADC device of FIG. 8A in accordance with an illustrative embodiment.

Performance: FIG. 9 shows a simulated operating band of the CT/DT SAR ADC device 100a of FIG. 8A in accordance with an illustrative embodiment. Specifically, FIG. 9 shows the simulated amplitude of the equivalent amplified $V_{res}$ by the dynamic amplifier (DA) (e.g., 120) as a function of both the input signal frequency and amplitude. As shown in FIG. 9, the 13-bit CT/DT SAR ADC device 110a of FIG. 8 can support an input signal frequency covering the whole Nyquist bandwidth with a peak-to-peak signal swing of 2.5V without appreciable increase in $V_{res}$. For a smaller input amplitude of 20% full swing, the 1$^{st}$ stage CT-SAR may tolerate up to 2:5 fs of input signal frequency.

Referring still to FIG. 9, $V_{res}$ may increase when both the input amplitude and frequency are large. In some embodiments, a low-pass anti-aliasing filter is implemented before the 2$^{nd}$ stage DT SAR to mitigate such operations.

In some embodiments, the low-pass anti-aliasing filter is integrated into the dynamic amplifier (e.g., 120). In other embodiments, the low-pass anti-aliasing filter is implemented in a separate circuit following and/or preceding the dynamic amplifier (e.g., 120). Of course, equivalent filtering circuits (e.g., band-pass, etc.) that performs low-pass filtering operations may be used. Per FIG. 9, ensuring a small $V_{res}$ of around 20 mV peak-to-peak significantly relaxes the linearity requirement of the inter-stage amplifier, which permits the use of an open-loop dynamic amplifier (DA) (e.g., 120), which generally has lower power and noise operation as compared to close-loop counterparts. Of course, closed-loop amplifiers (e.g., static amplifiers) may be used.

Floating Inverter-Based (FIB) Dynamic Amplifier

Figure 10A:
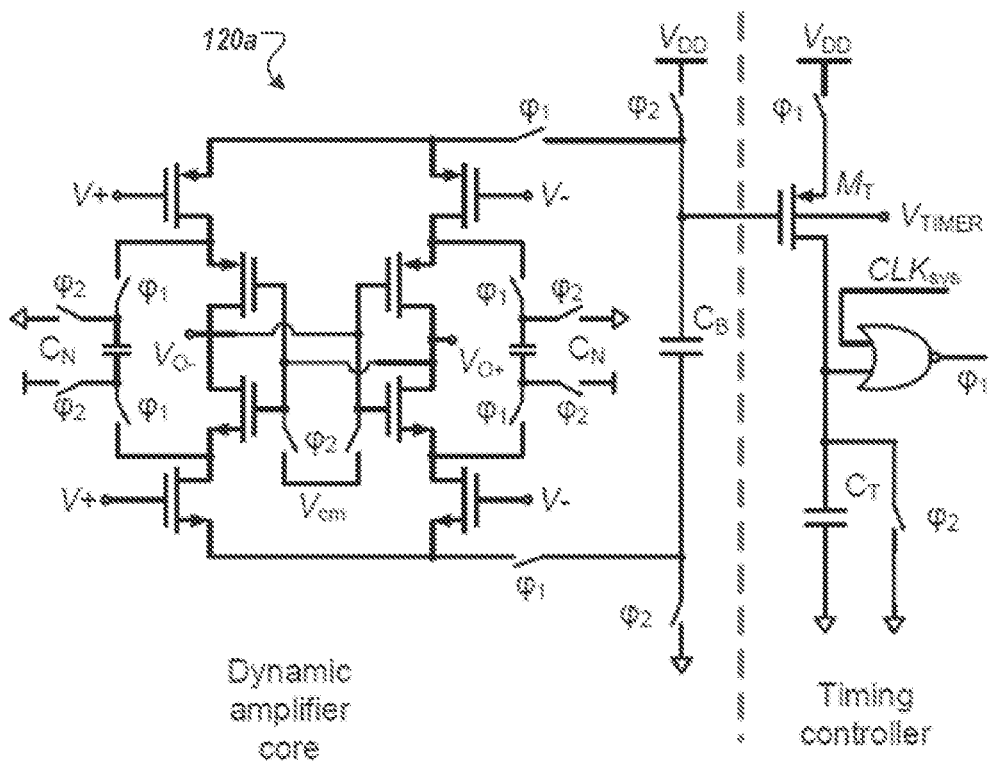
FIG. 10A shows a schematic of a floating inverter-based (FIB) dynamic amplifier (DA) that may be implemented in the exemplary CT/DT SAR ADC device in accordance with an illustrative embodiment.

FIG. 10A shows a schematic of a floating inverter-based (FIB) dynamic amplifier (DA) 120 (e.g., shown as 120a) in accordance with an illustrative embodiment. As shown in FIG. 10A, the floating inverter-based (FIB) dynamic amplifier 120a implements an inverter-based CMOS input stage. Such configuration may provide double transconductance properties as compared to a conventional DA, e.g., with a single NMOS or PMOS input pair [7], [19]—[21].

The floating inverter-based (FIB) dynamic amplifier 120a further includes a cross-coupled inverter inserted at the output to provide positive feedback to boost the dynamic amplifier (DA) voltage gain [29], [30]. The amplifier is shown in FIG. 10A to be powered by a 3.2-pF battery capacitor $C_B$, which is re-charged to VDD and GND during the dynamic amplifier (DA) reset phase. The battery capacitor $C_B$ may isolate the DA operation from the power supplies VDD and GND during the amplification phase, and thus, provides stronger rejection to the input common-mode (CM) voltage variations. The constant output CM voltage may reduce sensitivity of the instant FIB DA 120a to process, voltage, and temperature (PVT) variations, among others. The constant output CM voltage inherently guarantees that the NMOS pair current must match the PMOS pair current, and thus, the output CM current is zero, and thus obviates the need for an explicit output CM feedback loop [31]. Having a stable output CM voltage also allows a wide output signal swing and a large amplifier gain.

The floating inverter-based (FIB) dynamic amplifier 120a includes a single internal integration capacitor $C_N$ of 30 fF that is shared between NMOS and PMOS pairs. The single internal integration capacitor $C_N$ may reduce the bandwidth of the dynamic amplifier (DA) 120a and its "input referred noise." In contrast, in a conventional DA, each NMOS or PMOS pair may have its own integration capacitor. To this end, the floating inverter-based (FIB) dynamic amplifier 120a may have a reduced capacitor size of 4 times (i.e., a single $C_N$ rather than two 2 of such capacitors $C_N$). In the reset phase, $C_N$ is connected to $V_{DD}$ and GND.

Figure 10B:
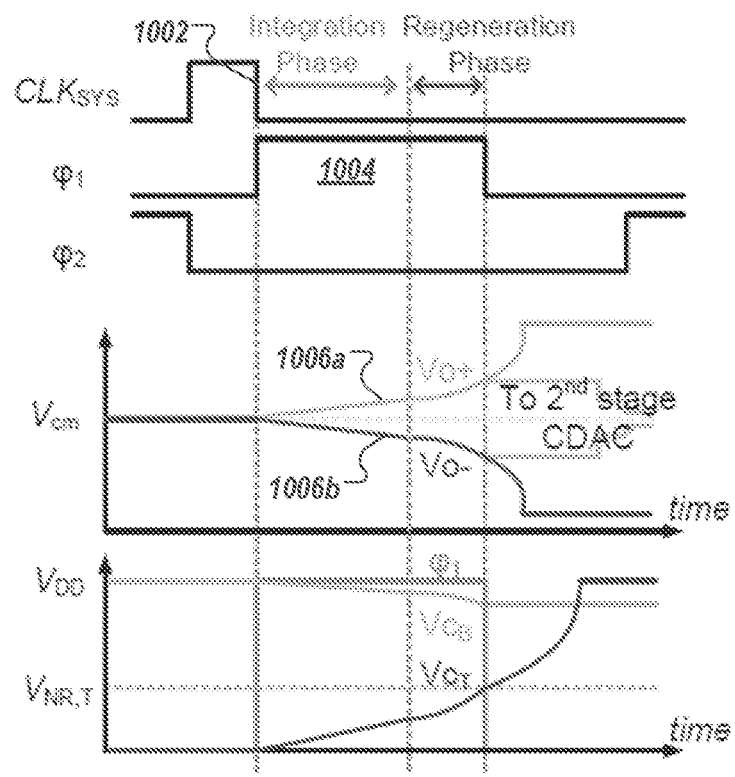
FIG. 10B shows a timing diagram and operating conditions of the floating inverter-based (FIB) dynamic amplifier of FIG. 10A in accordance with an illustrative embodiment.

FIG. 10B shows a timing diagram and operating conditions of the floating inverter-based (FIB) dynamic amplifier (e.g. 120) of FIG. 10A in accordance with an illustrative embodiment. As shown in FIG. 10B, at the falling edge (1002) of $CLK_{SYS}$, $\Phi_1$ (shown as 1004) goes high and the DA 120a is turned on. The DA output voltages $V_{o+}$ and $V_{o-}$ (1006a and 1006b, respectively) start to depart from each other due to DA input integration. After a certain time, the voltage across $C_N$ becomes sufficiently high and enables the cross-coupled inverter, which then leads to the exponential growth of $V_{o+}$ and $V_{o-}$ due to the positive feedback.

Although an output differential mode voltage is implemented, the output CM voltage remains nearly unchanged, e.g., with the use of the battery capacitor $C_B$ to power the DA, as discussed above. After a certain time, $C_B$ loses charge and its top-plate voltage $V_{CB}$ starts to drop below $V_{DD}$. When that occurs, the transistor MT starts to turn on and charge up $C_T$. Once the $C_T$ voltage $V_{CT}$ reaches the logical threshold of the NOR gate, $\Phi_1$ goes low, which ends the amplification phase. Because the DA amplification time may depend on how fast $M_T$ charges the $C_T$ (subject to PVT variations), to keep the DA gain constant, the DA time may be off-chip foreground calibrated by tuning the back-gate voltage of $M_T$ using $V_{TIMER}$ as in [29]. Background calibration can also be done as in [30].

As shown in FIG. 10B, indeed, the floating inverter-based (FIB) dynamic amplifier 120a of FIG. 10A may work in two operation phases, including a linear integration phase and a positive-feedback regeneration phase. The time of the integration phase and the bandwidth of the DA (e.g., 120a) may be primarily set by the value of the integration capacitor $C_N$. The total time that the DA is "on" may be set by $C_B$, $M_T$, and $C_T$, which adjusts the duration of the regeneration phase. Further description of such adjustments may be found in [30], [32].

FIGS. 11A and 11B show stimulated gain $g_m$ and simulated frequency response of the floating inverter-based (FIB) dynamic amplifier 120a of FIG. 10A in accordance with an illustrative embodiment. As shown in FIG. 11A, corresponding h(t) of the floating inverter-based (FIB) dynamic amplifier 120a is not constant but time varying. In additionally, the slight time dependence of h(t) can be observed to mildly change the equivalent transfer function of the FIB dynamic amplifier 120a. By comparing the frequency response of the FIB DA of FIG. 11B to the frequency response of an idealized circuit shown in FIG. 7D, the only difference is the removal of deep notches. Indeed, the FIB DA of FIG. 10A maintains in-band flatness and the out-of-band low-pass behavior of –20 dB/dec.

EXPERIMENTAL RESULTS

A study was conducted to evaluate performance of the CT/DT SAR ADC device (e.g., 100, 100a) as compared to state-of-art like ADCs in accordance with an illustrative embodiment.

Measured core size: FIG. 12 shows a photo of a fabricated die of a CT/DT SAR ADC device (e.g., 100, 110a) in a 40-nm LP-CMOS process. As shown in FIG. 12, the fabricated die of ADC (e.g., 100, 110a) has a substantially reduced core area of 0.01 mm². The supply voltage used by the $1^{st}$ stage CT SAR (e.g., 102) and the dynamic amplifier (e.g., 120, 120a) was set to 1.1 V to enhance the operation speed and to support a wide input signal swing. The $2^{nd}$ stage DT SAR (e.g., 106) used a supply voltage of 0.7 V to reduce the power consumption. At a sampling rate of 2 MS/s, the exemplary CT/DT SAR ADC used in the study was observed to consume a total power 25.2 µW in which the $1^{st}$ stage CT SAR (e.g., 102), the DA (e.g., 120, 120a), and the $2^{nd}$ stage DT SAR (e.g., 106) consumed 7.1 µW, 12.2 µW and 5.9 µW, respectively.

Within the $1^{st}$ stage CT SAR (e.g., 102), the comparator, the digital circuits, and the DAC was observed to consume 2.4 µW, 3 µW and 1.7 µW, respectively. Within the $2^{nd}$ stage DT SAR (e.g., 106), the comparator, the digital circuits, and the DAC was observed to consume 1.9 µW, 1.9 µW and 2.1 µW, respectively.

Figure 13A:
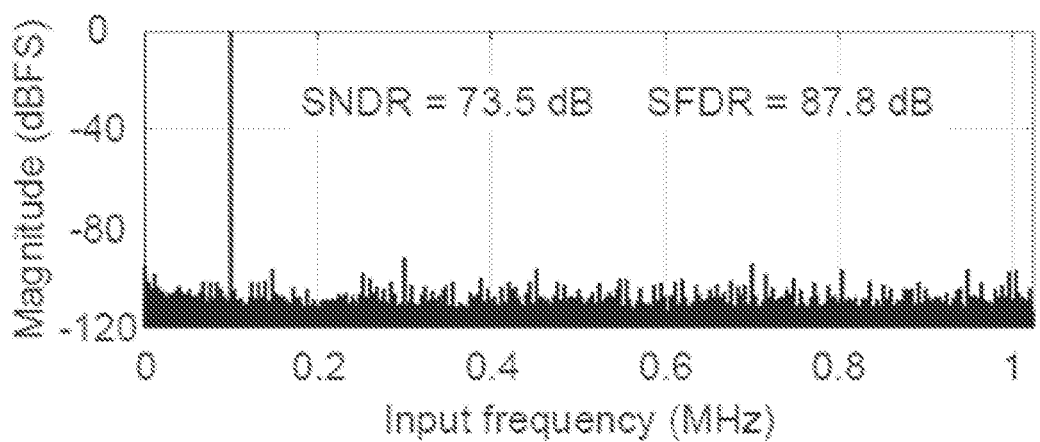
FIGS. 13A and 13B each shows measured spectrum performance of the CT/DT SAR ADC device of FIG. 12 in accordance with an illustrative embodiment.
Figure 13B:
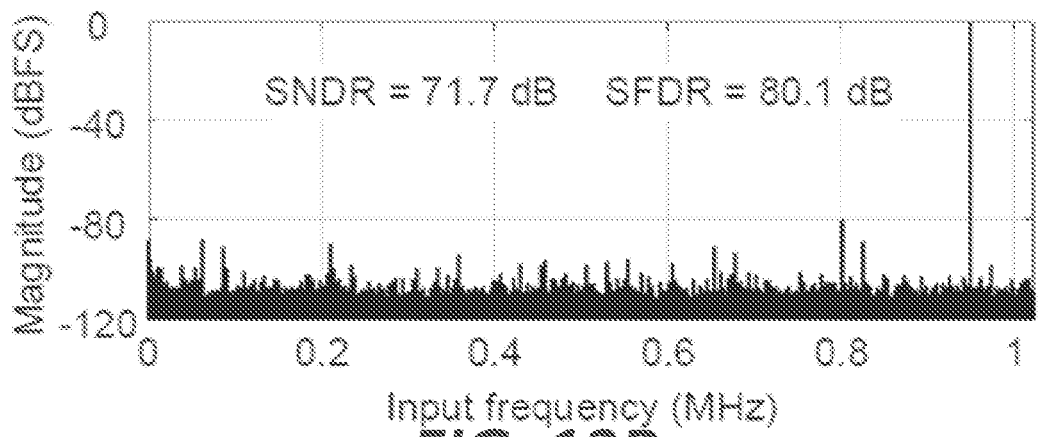

Measured SNDR and SFDR for Different Input Signals: FIGS. 13A and 13B each shows the measured spectrum performance of the CT/DT SAR ADC device of FIG. 12 in accordance with an illustrative embodiment. In FIG. 13A, a low-frequency signal was applied. In FIG. 13B, a near Nyquist-rate input signal was applied. As shown in FIGS. 13A, with a full-swing input at 100 kHz, the measured SNDR and SFDR was observed to be about 73.5 and 87.8 dB, respectively. As shown in FIG. 13B, with a 0-dBFS near Nyquist-rate input of 950 kHz, the measured SNDR and SFDR was observed to be about 71.7 and 80.1 dB, respectively.

The experimental results are shown with foreground calibration being performed for both the 1st- and the 2nd-stage capacitor mismatches. Without such calibration, the SNDR and SFDR for the near Nyquist-rate input signal was observed to be 60 dB and 65.4 dB, respectively. As part of the calibration, the gain and the offset of the DA and the offset of the 1st-stage comparator were also calibrated. In addition, the 1st-stage SAR logic delay was calibrated to minimize the time difference between the end of 1st-stage SAR cycles and the DA starting edge.

Figure 14:
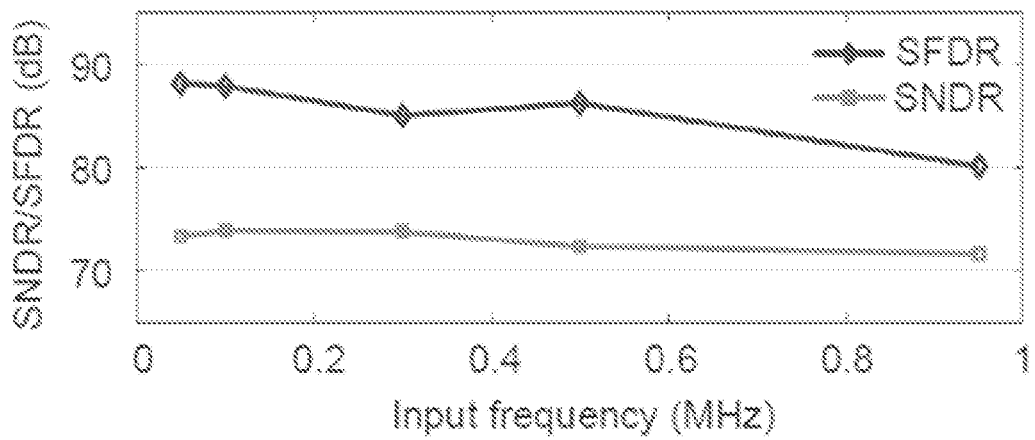
FIG. 14 shows measured SNDR and SFDR of the CT/DT SAR ADC device of FIG. 12 in reference to different input frequencies in accordance with an illustrative embodiment.
Figure 15:
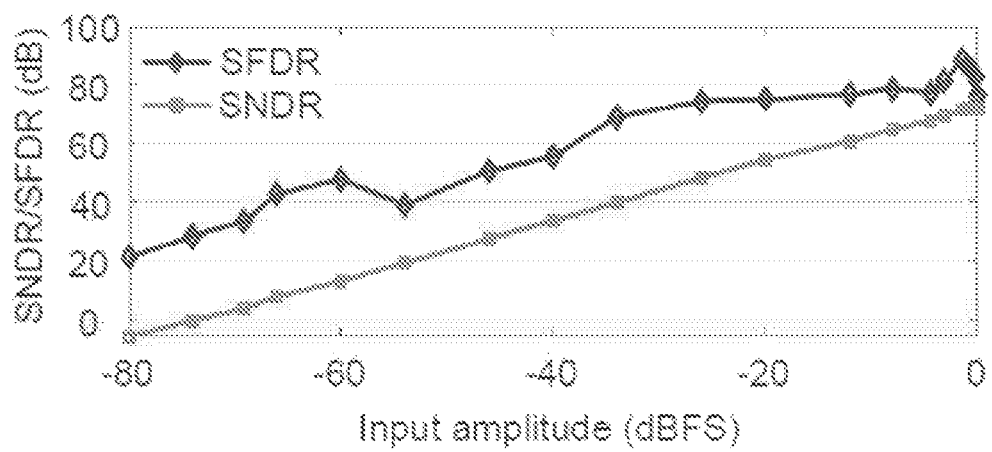
FIG. 15 shows an input amplitude sweep of the CT/DT SAR ADC device of FIG. 12 in accordance with an illustrative embodiment.

Measured Input Frequency Operation: FIG. 14 shows measured SNDR and SFDR of the CT/DT SAR ADC device of FIG. 12 in reference to different input frequencies in accordance with an illustrative embodiment. FIG. 15 shows an input amplitude sweep of the CT/DT SAR ADC device of FIG. 12 in accordance with an illustrative embodiment.

As shown in FIG. 14, the measured dynamic range of the of CT/DT SAR ADC device of FIG. 12 was observed to be about 73.6 dB. Indeed, the results show that the CT/DT SAR ADC device of FIG. 12 properly worked as a Nyquist-rate ADC over various input amplitude and frequency settings.

As a part of the study, performance of the CT/DT SAR ADC device of FIG. 12 was evaluated in a comparison to other state-of-art ADCs. Table 1 shows performance summary of the CT/DT SAR ADC device of FIG. 12 as compared to other state-of-the-arts ADCs.

Redundancy of the First Successive Approximation Register Circuit

Redundancy of the $1^{st}$ stage CT SAR operation may be provided in the $2^{nd}$ stage SAR operation. As used herein, redundancy refers to repetition of certain SAR cycles in the $1^{st}$ stage CT SAR operation being performed again in the $2^{nd}$ SAR operation. Because the input (e.g., 110) is allowed to float in the continuous-time domain, errors between the input 110 and prior SAR operation may be introduced as the inputs (e.g., 110) may vary, in later SAR cycles, from those used to in prior SAR cycle generate digital outputs (e.g., 112). The redundancy (i.e., repetition) of the prior SAR operations in the $2^{nd}$ SAR operation facilitates the error-correction of errors that may arise from the $1^{st}$ stage CT SAR operation operating in the continuous-time domain. In some embodiments, sufficient redundancy is included in each bit while allowing the continuous-time SAR to tightly track the input (e.g., 110). In addition, the operation following the CT-SAR may be configured to be triggered immediately upon the CT-SAR conversion residue (e.g., 118) being generated to minimize any overall delay mismatch.

TABLE 1

| Specifications | [1] | [4] | [5] | [6] | [14] | [15] | This work |
|---|---|---|---|---|---|---|---|
| Architecture | SAR | SAR | Pipeline | Pipe-SAR | CT pipeline | CT pipeline | CT two-step SAR |
| kT/C noise attenuated | X | X | X | X | ✓ | ✓ | ✓ |
| $1^{st}$-stage input capacitance (pF) | 9 | 16 | 3.2 | 4 | Resistive | Resistive | 0.12 |
| Area (mm$^2$) | 0.18 | 0.32 | 1 | 0.054 | 1.9 | 5.1 | 0.01 |
| Technology | 40 nm | 40 nm | 180 nm | 65 nm | 180 nm | 28 nm | 40 nm LP |
| Resolution (bits) | 14 | 15 | 15 | 13 | 11 | N/A | 13 |
| $f_s$ (MS/s) | 0.032 | 0.02 | 10 | 50 | 26 | 9000 | 2 |
| Input Swing ($V_{pp,diff}$) | 1.6 | 1.8 | 2.5 | 2.4 | 3.6 | N/A | 2.5 |
| SFDR$_{NYQ}$ (dB) | 78.5 | 95.1 | 95.4 | 84.6 | 67 | 73 | 79.4 |
| SNDR$_{NYQ}$ (dB) | 69.7 | 74.1 | 76.8 | 70.9 | 61.1 | 68 | 71.7 |
| ENOB$_{NYQ}$ (bit) | 11.3 | 12 | 12.5 | 11.5 | 9.9 | 11 | 11.6 |
| Total Power (uW) | 0.352 | 1.17 | 5100 | 1000 | 26700 | 2330000 | 25.2 |
| FoM$_w$ (fJ/step) | 4.4 | 14.1 | 45 | 6.9 | 1113 | 495 | 3.9 |
| FoM$_s$ (dB) | 176.3 | 173.4 | 170 | 174.9 | 148 | 160 | 177.8 |

As shown in Table 1, the input capacitor of the CT/DT SAR ADC device of FIG. 12 configured with CT front-end with sampling noise suppression is orders of magnitude smaller than others with similar SNDR. And, as reported above, the core chip area of the device (with the reduced capacitor size) has an area of about 0.01 mm$^2$, which is substantially smaller than those of similar class devices. Per Table 1, the Walden and Schreier figure-of-merits (FoM) with the Nyquist frequency input are 3.9 fJ/conversion-step and 177.8 dB, respectively, and are in line with the state-of-the-arts.

Indeed, the exemplary CT/DT SAR ADC device (e.g., 100, 100a) provides a two-step ADC architecture with a 1st-stage CT SAR with S/H circuit removed. The exemplary CT/DT SAR ADC device (e.g., 100, 100a) breaks the fundamental tradeoff between the input capacitor size and the sampling noise. The CT SAR conversion error can be addressed by use of redundancy and by high-speed SAR operation in the first stage. With a substantial reduction in the input capacitor size (as compared to conventional SAR ADC devices), the power, chip size, and design complexity of the ADC driver and the reference buffer can be relaxed, leading to significant benefits on the system level.

DISCUSSION

In a classic DT SAR, a single capacitor array is used for both input sampling and SAR DAC in a time-duplex manner. The benefits may be fewer number of capacitors and no signal attenuation. However, the DT SAR works with the S/H circuit.

To realize the CT SAR and ensure simultaneous input tracking and SAR conversion, the input capacitor and the SAR DAC have to be separated (e.g., as shown in FIG. 1). Indeed, in FIG. 1, the CT SAR (e.g. 102) includes more capacitors and may have an attenuation factor of $C_{IN}=C_T$ from $V_{in}$ to $V_{res}$, where $C_T$ represents all the capacitance at $V_{res}$, including $C_{IN}$, $C_{DAC}$, and the parasitic capacitance (including the input capacitance of the comparator and the amplifier).

The signal attenuation results in an increased noise contribution from the inter-stage amplifier. Because the $1^{st}$-stage sampling noise is reduced by the lack of a S/H circuit, the inter-stage amplifier can generate more noise while keeping the total ADC input referred noise unchanged. As a result, the increase in the amplifier power is not significant. Overall, the additional cost of implementing the $1^{st}$ stage CT SAR if offset wholly by the suppression of sampling noise in the $1^{st}$ stage and the substantial reduction in input capacitor size, which can lead to not only significant area savings for the ADC core itself but also potential power savings for the input and reference buffers. The detailed analysis of the noise is later discussed herein.

Unlike prior CT pipeline designs that may use input resistive coupling and a current-source DAC (IDAC) [14], [15], the exemplary CT/DT SAR ADC device (e.g., 100, 100a) may use input capacitive coupling and a capacitor $D_{AC}$ ($C_{DAC}$) (and thus avoid noise from the input resistor and the IDAC as well as static power associated with the IDAC). The tradeoff, in some embodiments, is that capacitive coupling may block DC signals. A pseudo-resistor $R_B$ is used, in some embodiments, to provide the DC bias for the comparator input. Example of such pseudo-resistor RB is provided in [23], [24]. The pseudo-resistor $R_B$ and the capacitors may form a high-pass filter that blocks the low-frequency input. It is contemplated that the exemplary CT/DT SAR ADC device (e.g., 100, 100a) may be used for a wide range of applications where the information does not reside at DC, including, for example, but not limited to, audio, biological, and communication signals. Proper pass band frequencies may be suitably configured for each of the applications.

Figure 16A:
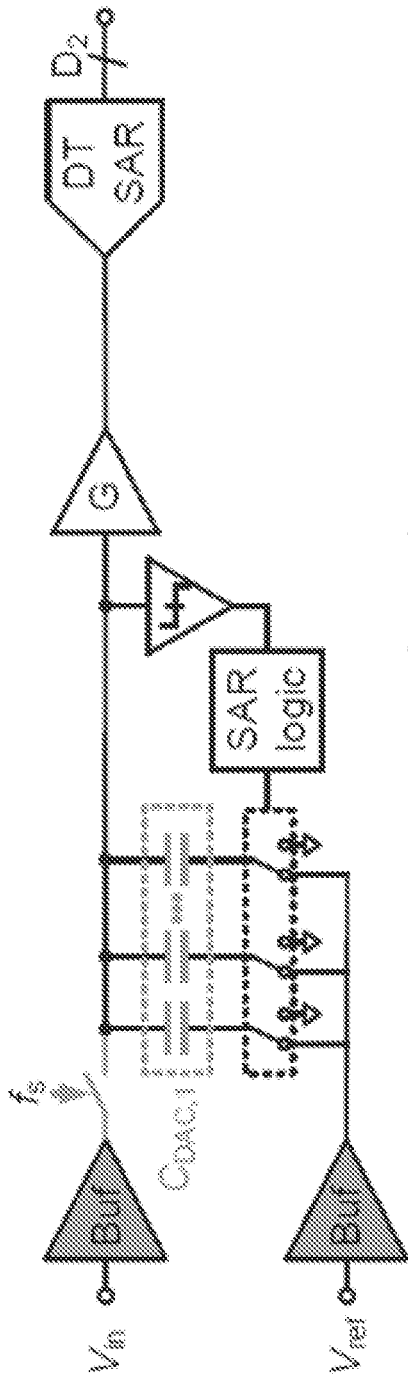
FIG. 16A shows an example two-step SAR ADC with the front-end sampler.

Conventional DT SAR: Discrete-time (DT) ADC typically has a front-end S/H circuit. FIG. 16A shows an example classic two-step SAR ADC with the front-end sampler. The benefit of having a frontend S/H circuit is that it converts a continuous-time (CT) input into a DT signal that stays unchanged between samples, which simplifies the following analog signal processing operations (e.g., quantization, subtraction, and amplification). Nevertheless, the use of the front-end S/H can bring unwanted sampling noise, which may pose a fundamental SNR limit for the ADC device. The sampling noise may be, and is typically, suppressed passively by increasing the capacitor size [1]-[13]. For example, the total differential sampling capacitors is often greater than 2.1 pF to achieve a sampling noise limited SNR of 80 dB with a 2.5-V peak-to-peak differential signal swing, and capacitor may be quadrupled for every 1-bit increase in the resolution of the device. Such a large input capacitor may make it difficult to design the S/H circuit and may lead to increased ADC power and area.

In addition, as shown in FIG. 16A, a large input capacitor may pose critical challenges for both the ADC buffer and the reference buffer. To meet the stringent linearity requirement of high-resolution ADCs, the buffers may consume a significant amount of power, which can be comparable or even higher than the ADC itself. Thus, breaking such trade-off between the sampling noise and the capacitor size has benefits and utility, e.g., in facilitating the use of small input capacitor without incurring significant noise penalty.

Figure 16B:
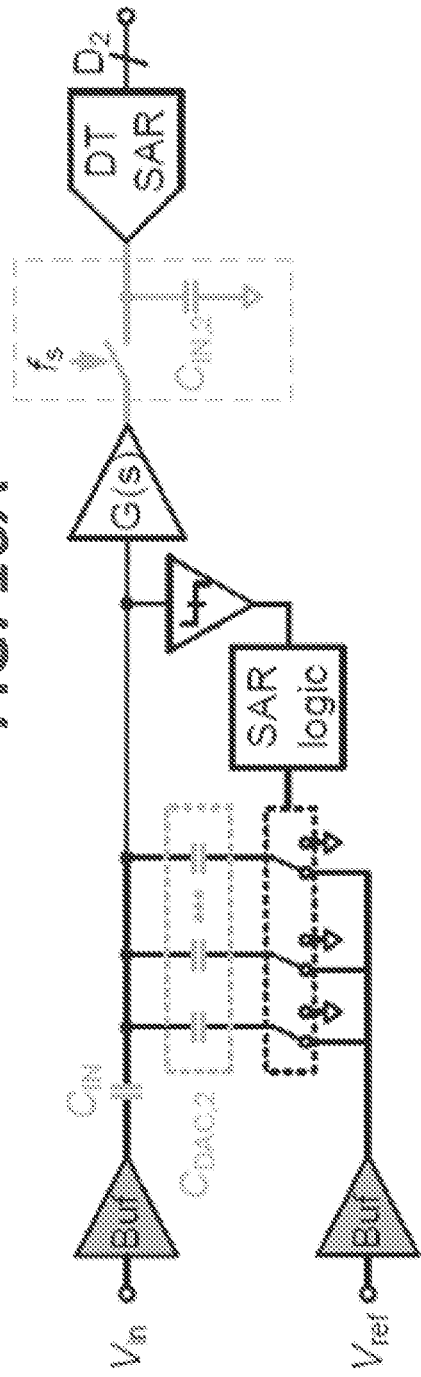
FIG. 16B shows a basic architecture of the exemplary CT/DT SAR ADC device in which a front-end S/H circuit is exclude from the $1^{st}$ stage in accordance with an illustrative embodiment.

FIG. 16B shows a basic architecture of the exemplary CT/DT SAR ADC device (e.g., 100, 100a) in which a front-end S/H circuit is exclude from the $1^{st}$ stage of the two-step ADC and in which $1^{st}$ stage operates in the CT domain [14], [15] in accordance with an illustrative embodiment. As shown in FIG. 16B, the $1^{st}$-stage CT SAR has in-band thermal noise (e.g., due to the switch resistance) that is much smaller than kT/C, as its sampling-free CT operation prevents wide-band noise folding, which otherwise would be the dominant contributor to the sampling noise. The inter-stage amplifier (e.g., 120) may also processes the 1st-stage conversion residue in CT, and acts as a low-pass filter that suppresses the out-of-band thermal noise from the switch resistors. Consequently, the $1^{st}$-stage capacitor size is not bounded by the kT/C limit and can be significantly reduced. Unlike the classic two-step ADC, the sampling operation is moved to the 2nd stage, as shown in FIG. 16B. Although the $2^{nd}$ stage may suffer from its own sampling noise, the noise is substantially suppressed by the inter-stage gain when input referred, thus permitting the use of a small capacitor in the $2^{nd}$ stage too. Overall, the use of the S/H-free CT $1^{st}$ stage can break the link between the sampling noise and the capacitor size, making it possible to design high resolution Nyquist-rate ADCs with small capacitors.

Although removing the S/H circuit can bring the benefit of suppressed sampling noise, it can cause the $1^{st}$ stage conversion residue to go out of bound in certain scenarios.

FIGS. 17A, 17B, 17C, and 17D show simplified models of various two-step ADC topologies for comparison, including that of the exemplary CT/DT SAR ADC device in accordance with an illustrative embodiment.

Figure 17A:
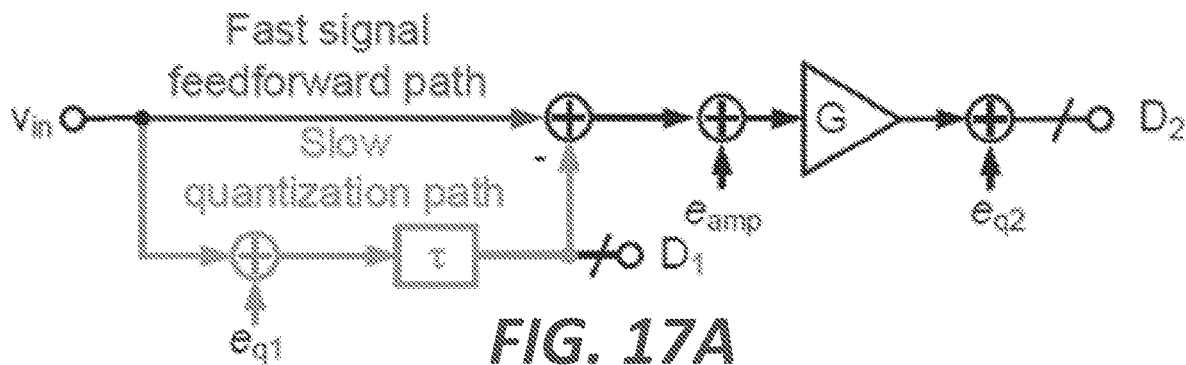
FIGS. 17A, 17B, 17C, and 17D show simplified models of various two-step ADC topologies for comparison, including that of the exemplary CT/DT SAR ADC device in accordance with an illustrative embodiment.

FIG. 17A shows a simplified model of a two-step ADC in which $D_i$ represents the digital output code of the $i^{th}$ stage; $e_{qi}$ represents the quantization noise added of the $i^{th}$ stage; and $e_{amp}$ represents the noise of an inter-stage amplifier. As shown in FIG. 17A, the input signal $V_{in}$ goes through two different paths in the $1^{st}$ stage: in the upper fast path, the signal directly goes to the inter-stage amplifier; and in the lower slow path, the signal goes through the sub-ADC, the sub-DAC, and the analog subtractor. Each of the analog signal processing steps can introduce extra delays, which are represented in a single block. In a classic two-step ADC with the S/H circuit, the path delay mismatch is not necessarily an issue because the sampled input does not change. However, for a S/H free CT 1st-stage in which the input waveform (e.g., 110) can change, the delay mismatch can cause output signals from the two paths to be misaligned, resulting in larger conversion residues and potential saturation of the inter-stage amplifier and the 2nd-stage ADC.

Figure 17B:
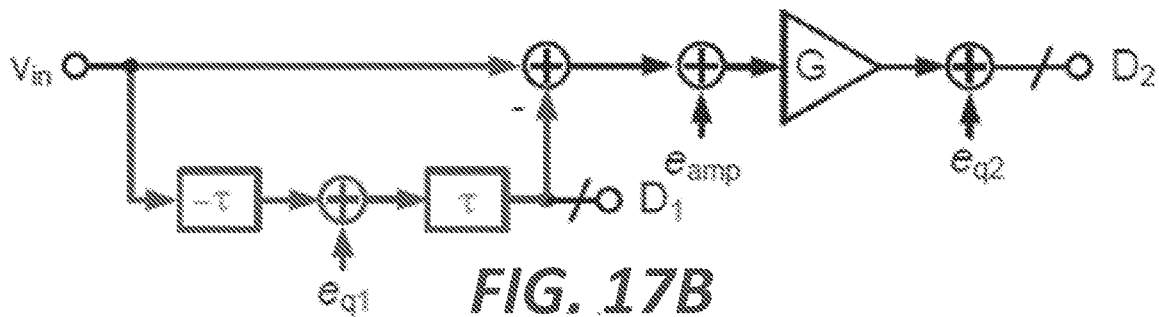

Another approach to address the delay mismatch may be to insert a negative delay (−τ) block in the slow path to cancel the positive delay [14], as shown in FIG. 17B. Even though a pure negative delay is non-causal and unpractical, a negative delay within the signal band can be realized by using an analog prediction filter. However, analog prediction filter are generally implemented using power-hungry wide-band op-amps to perform full-signal-band prediction. Moreover, to satisfy causality, the analog prediction filter may introduce positive delay for out-of-band high-frequency signals. This may increase the delay mismatch between the two paths, causing the $1^{st}$ stage conversion residue to increase for out-of-band signals. Hence, to keep the $1^{st}$ stage conversion residue within the allowable range, an anti-aliasing filter (as discussed herein) may be implemented to provide stronger attenuation for out-of-band signals, which makes its design more challenging.

Figure 17C:
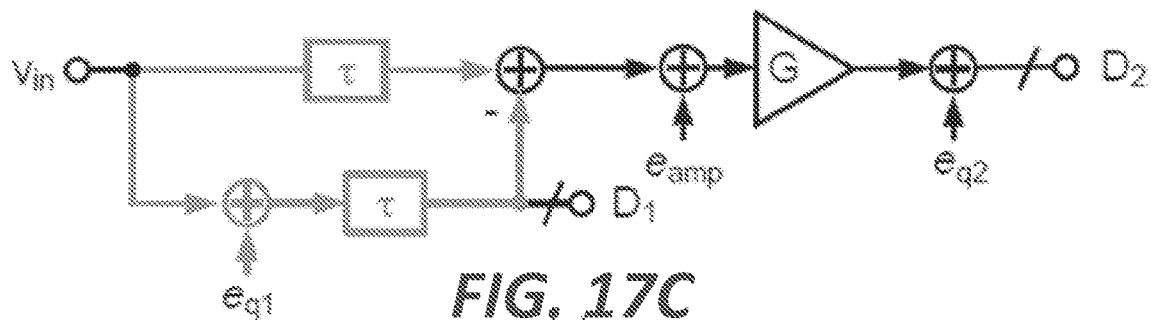

Another approach to address the delay mismatch issue is to insert a positive delay block in the fast path [15], as shown in FIG. 17C. In some embodiments, the positive delay can be realized by using an LC lattice filter. The approach may be fully passive and power efficient, but since it may rely on delay matching, the approach may require careful tuning of components to compensate for process and temperature variations. Furthermore, while it may work for high-speed GHz operations, it may not be suited for low-to-medium speed applications (e.g., sensors), as the required long delay could result in large LC values and excessive chip area. In addition, the design of filters to avoid amplitude attenuation or phase modulation can be non-trivial.

Figure 17D:
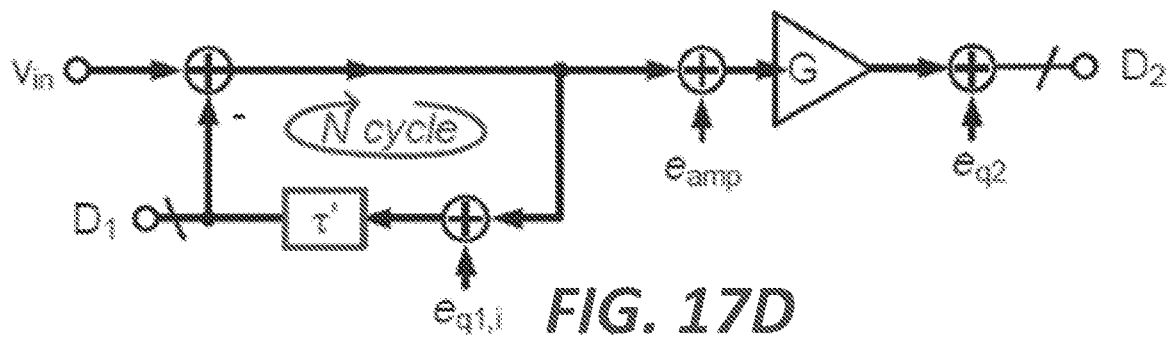

The exemplary CT/DT SAR ADC device (e.g., 100, 100a) addresses the delay mismatch problem using a CT-SAR based 1st-stage as shown in FIG. 17D. Of course, the exemplary CT/DT SAR ADC device may employ the CT-SAR based 1st-stage in combination with any of the other approaches and techniques described herein.

In a conventional two-step ADC, the slow quantization path consists of a multi-bit flash, a multi-bit DAC, and an analog subtractor, whose total aggregated delay tends to be relatively large. In contrast, in FIG. 17D, each SAR cycle of the 1st stage CT SAR includes only a single-bit comparison, a single-bit DAC, and a built-in subtraction operation to provide a SAR delay that is much shorter. In FIG. 17D, $e_{q1,i}$ represents the quantization noise added during the $i^{th}$ iteration. Even though a multi-bit quantization (e.g., 7-bit) requires multiple SAR cycles, their delays do not accumulate because the CT-SAR operates on the CT input. Every SAR cycle thus sees a new instantaneous input.

In some embodiments, to further reduce the delay, the CT SAR adopts asynchronous clocking [16] and dynamic logic [17], [18]. As the input moves during the CT SAR operation, the prior SAR comparator decisions can be no longer correct. Sufficient redundancy may be prepared in each bit such that the CT SAR can still tightly track the input. Once the CT-SAR finishes, the conversion residue is readily available, and the dynamic amplifier can be triggered immediately, minimizing delay. In their combination, the overall delay mismatch can be made very short. Indeed, no prediction filter or LC lattice filter is needed, leading to lower design complexity, as well as reduced chip area and power. In addition, different from prior CT pipelined ADCs [14], [15] that use input resistor and current-source DAC, the exemplary CT/DT SAR ADC device (e.g., 100, 100a) may use input capacitor and capacitive DAC. Because capacitors can be made to operate noise-free and not consume static current, the exemplary CT/DT SAR ADC device (e.g., 100, 100a) can operate efficiently with respect to both noise and power.

To verify the proposed techniques, as discussed above, a 13-bit prototype ADC was built using the 40 nm CMOS process. In that prototype, an input capacitor of only 120 fF was implemented, which is more than 20 times smaller than what would be needed in a comparable classic DT two-step ADC. The inter-stage amplifier in that prototype also implemented a floating inverter based (FIB) dynamic amplifier (DA) topology. Compared to classic static amplifiers, the fabricated FIB DA has low-power and low-noise performance. Compared to integrator based DA [7], [19]—[21], the fabricated FIB DA also provided higher gain and stronger rejection to the input common-mode variations. Operating at 2 MS/s, the ADC achieves 72-dB SNDR across the Nyquist band while consuming only 25 W of power and 0.01 mm² of area.

Noise Analysis

Figure 18A:
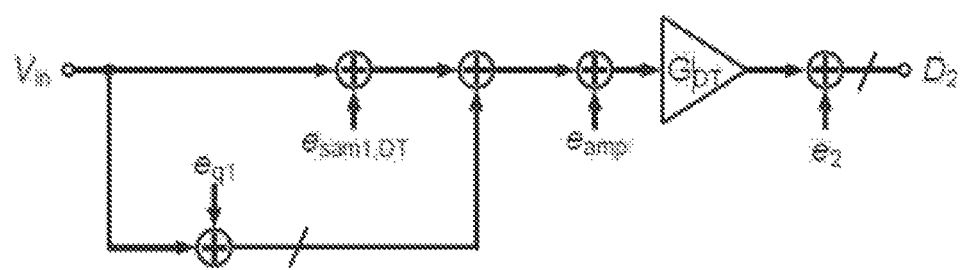
FIGS. 18A and 18B, respectively, shows a noise model for a conventional DT-SAR ADC and the exemplary CT/DT SAR ADC device in accordance with an illustrative embodiment.
Figure 18B:
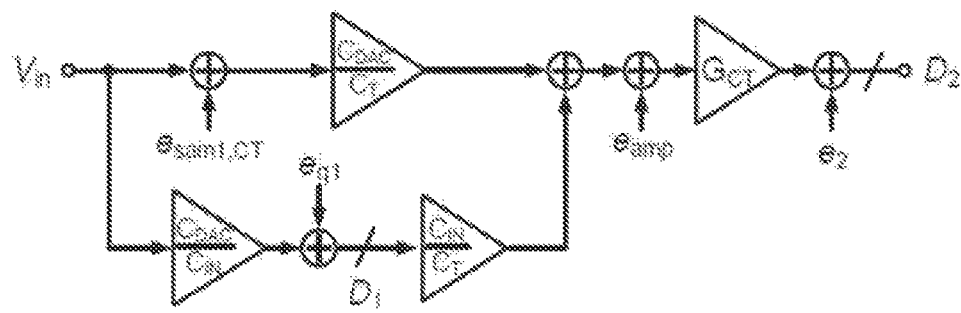

FIGS. 18A and 18B, respectively, shows a noise model for a conventional DT-SAR ADC and the exemplary CT/DT SAR ADC device (e.g., 100, 100a) in accordance with an illustrative embodiment. To simplify the analysis, the noise model mainly considers the 1st-stage sampling noise $e_{sam1}$, the inter-stage amplifier noise $e_{amp}$, and the 2nd-stage noise $e_2$ (which includes the 2nd-stage sampling noise, the quantization noise, and the comparator noise).

For the DT-SAR ADC of FIG. 17A, the total input referred noise $e_{tot,DT}$ can be derived as Equation 6, which can be rearranged as Equation 6.1.

$$e_{tot,DT} = e_{sam1,DT} + e_{amp} + \frac{e_2}{G_{DT}} \quad \text{(Equation 6)}$$

$$= \frac{kT}{C_{DAC}} + e_{amp} + \frac{e_2}{G_{DT}} \quad \text{(Equation 6.1)}$$

In Equations 6 and 6.1, $G_{DT}$ represents the inter-stage gain in the DT case, and $C_{DAC}$ represents the total CDAC capacitance. For the CT-SAR ADC of FIG. 17B, the total input-referred noise $e_{tot,CT}$ can be derived as Equation 7, which can be rearranged as Equation 7.1.

$$e_{tot,CT} = e_{sam1,CT} + \frac{C_T}{C_{DAC}} \cdot \left( e_{amp} + \frac{e_2}{G_{CT}} \right) \quad \text{(Equation 7)}$$

$$= 4ktR_{eq} \cdot BW_{DA} + \frac{C_T}{C_{DAC}} \cdot \left( e_{amp} + \frac{e_2}{G_{CT}} \right) \quad \text{(Equation 7.1)}$$

In Equations 7 and 7.1, $C_T$ represents the total capacitance at the 1st-stage comparator input node, $G_{CT}$ represents the inter-stage gain in the CT case, $BW_{DA}$ represents the DA bandwidth, and $R_{eq}$ represents the equivalent resistance of the 1st-stage CT input sampling network.

For the comparison, the analysis assumes that both the CT and DT ADCs have the same nominal resolution (i.e., the quantization noise) to derive $G_{DT}=G_{CT}$ ($C_T/C_{DAC}$). When this quantity is substituted into Equation 7, the result is provided in Equation 8.

$$e_{tot,CT} = \frac{BW_{DA}}{1/(R_{eq}C_{DAC})} \cdot \frac{kT}{C_{DAC}} + \frac{C_T}{C_{DAC}} \cdot e_{amp} + \frac{e_2}{G_{DT}} \quad \text{(Equation 8)}$$

Comparing Equation 6 and Equation 8, two differences can be observed. First, the 1st stage sampling noise is greatly attenuated in the exemplary CT/DT SAR ADC device (e.g., 100, 100a). In the conventional DT-SAR ADC, with the noise power spectral density (PSD) being 4 $kTR_{eq}$ and the noise BW being 1/($R_{eq}C_{DAC}$), the 1st-stage sampling noise is $kT=C_{DAC}$. In contrast, in the exemplary CT/DT SAR ADC device (e.g., 100, 100a), the sampling noise PSD and BW are de-coupled. The effective noise BW is not 1/($R_{eq}C_{DAC}$), but $BW_{DA}$. The sampling noise reduction ratio is $BW_{DA}/[1/(R_{eq}C_{DAC})]$, which is the ratio of the DA BW over the 1st-stage sampling network BW.

In having a small $C_{DAC}$ (e.g., 60 fF) and a small $R_{eq}$, the 1st stage sampling network BW can be made much larger than the DA BW, leading to the 1st stage sampling noise much smaller than $kT/C_{DAC}$. Second, the CT operation with the capacitive input network comes with a penalty of input signal attenuation, which results in the increased inter-stage amplifier noise by a factor of $C_T/C_{DAC}$. To avoid high power consumption of the inter-stage amplifier, the overall ADC noise budgeting is optimized in this design. Since the 1st stage sampling noise is reduced, a larger portion of noise budget can be assigned to the inter-stage amplifier, which lowers its power consumption. Overall, the proposed CT-SAR technique can be used to reduce the 1st stage capacitor sizes and the core ADC area without causing large sampling noise penalty. Moreover, with the significantly reduced 1st stage capacitor sizes, the performance requirements of the ADC driver and the reference buffer can be relaxed, which can lead to power saving on the system level.

Table 2 shows an input referred noise breakdown of the exemplary CT/DT SAR ADC device (e.g., 100, 100a). The measurement result matches well with the simulation result.

TABLE 2

|  | Simulation results | Measurement results |
| --- | --- | --- |
| Quantization noise | 76.8 μV | N/A |
| DA noise | 171.1 μV | N/A |

TABLE 2-continued

|  | Simulation results | Measurement results |
|---|---|---|
| $1^{st}$-stage noise | 82.8 µV | N/A |
| $2^{nd}$-stage noise | 42.5 µV | N/A |
| Total noise | 209.4 µV | 215.7 µV |

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification. Throughout this application, various publications are referenced. The disclosures of these publications in their entireties are hereby incorporated by reference into this application in order to more fully describe the state of the art to which the methods and systems pertain.

Also, unless clearly stated otherwise, when any number or range is described herein, that number or range is approximate. When any range is described herein, unless clearly stated otherwise, that range includes all values therein and all sub ranges therein. Any information in any material (e.g., a United States/foreign patent, United States/foreign patent application, book, article, etc.) that has been incorporated by reference herein, is only incorporated by reference to the extent that no conflict exists between such information and the other statements and drawings set forth herein. In the event of such conflict, including a conflict that would render invalid any claim herein or seeking priority hereto, then any such conflicting information in such incorporated by reference material is specifically not incorporated by reference herein.

Although example embodiments of the present disclosure are explained in detail herein, it is to be understood that other embodiments are contemplated. Accordingly, it is not intended that the present disclosure be limited in its scope to the details of construction and arrangement of components set forth in the following description or illustrated in the drawings. The present disclosure is capable of other embodiments and of being practiced or carried out in various ways.

In summary, while the present invention has been described with respect to specific embodiments, many modifications, variations, alterations, substitutions, and equivalents will be apparent to those skilled in the art. The present invention is not to be limited in scope by the specific embodiment described herein. Indeed, various modifications of the present invention, in addition to those described herein, will be apparent to those of skill in the art from the foregoing description and accompanying drawings. Accordingly, the invention is to be considered as limited only by the spirit and scope of the disclosure, including all modifications and equivalents.

Still other embodiments will become readily apparent to those skilled in this art from reading the above-recited detailed description and drawings of certain exemplary embodiments. It should be understood that numerous variations, modifications, and additional embodiments are possible, and accordingly, all such variations, modifications, and embodiments are to be regarded as being within the spirit and scope of this application. For example, regardless of the content of any portion (e.g., title, field, background, summary, abstract, drawing figure, etc.) of this application, unless clearly specified to the contrary, there is no requirement for the inclusion in any claim herein or of any application claiming priority hereto of any particular described or illustrated activity or element, any particular sequence of such activities, or any particular interrelationship of such elements. Moreover, any activity can be repeated, any activity can be performed by multiple entities, and/or any element can be duplicated. Further, any activity or element can be excluded, the sequence of activities can vary, and/or the interrelationship of elements can vary. Unless clearly specified to the contrary, there is no requirement for any particular described or illustrated activity or element, any particular sequence or such activities, any particular size, speed, material, dimension or frequency, or any particularly interrelationship of such elements. Accordingly, the descriptions and drawings are to be regarded as illustrative in nature, and not as restrictive. Moreover, when any number or range is described herein, unless clearly stated otherwise, that number or range is approximate. When any range is described herein, unless clearly stated otherwise, that range includes all values therein and all sub ranges therein. Any information in any material (e.g., a United States/foreign patent, United States/foreign patent application, book, article, etc.) that has been incorporated by reference herein, is only incorporated by reference to the extent that no conflict exists between such information and the other statements and drawings set forth herein. In the event of such conflict, including a conflict that would render invalid any claim herein or seeking priority hereto, then any such conflicting information in such incorporated by reference material is specifically not incorporated by reference herein.

The following patents, applications and publications as listed below and throughout this document are hereby incorporated by reference in their entirety herein.

REFERENCE LIST

[1] P. Harpe, E. Cantatore, and A. van Roermund, "11.1 An oversampled 12/14b SAR ADC with noise reduction and linearity enhancements achieving up to 79.1 dB SNDR," in 2014 IEEE International Solid-State Circuits Conference Digest of Technical Papers (ISSCC), pp. 194-195, February 2014.

[2] B. Verbruggen, J. Tsouhlarakis, T. Yamamoto, M. Iriguchi, E. Martens, and J. Craninckx, "A 60 dB SNDR 35 MS/s SAR ADC With Comparator-Noise-Based Stochastic Residue Estimation," IEEE Journal of Solid-State Circuits, vol. 50, pp. 2002-2011, September 2015.

[3] L. Chen, X. Tang, A. Sanyal, Y. Yoon, J. Cong, and N. Sun, "A 0.7-V 0.6-W 100-kS/s Low-Power SAR ADC With Statistical Estimation-Based Noise Reduction," IEEE Journal of Solid-State Circuits, vol. 52, pp. 1388-1398, May 2017.

[4] M. Shim, S. Jeong, P. D. Myers, S. Bang, J. Shen, C. Kim, D. Sylvester, D. Blaauw, and W. Jung, "Edge-Pursuit Comparator: An Energy-Scalable Oscillator Collapse-Based Comparator With Application in a 74.1 dB SNDR and 20 kS/s 15 b SAR ADC," IEEE Journal of Solid-State Circuits, vol. 52, pp. 1077-1090, April 2017.

[5] B. Hershberg, S. Weaver, K. Sobue, S. Takeuchi, K. Hamashita, and U. Moon, "Ring amplifiers for switched-capacitor circuits," in 2012 IEEE International Solid-State Circuits Conference, pp. 460-462, February 2012.
[6] Y. Lim and M. P. Flynn, "A 1 mW 71.5 dB SNDR 50 MS/s 13 bit Fully Differential Ring Amplifier Based SAR-Assisted Pipeline ADC," IEEE Journal of Solid-State Circuits, vol. 50, pp. 2901-2911, December 2015.
[7] H. Huang, H. Xu, B. Elies, and Y. Chiu, "A Non-Interleaved 12-b 330-MS/s Pipelined-SAR ADC With PVT-Stabilized Dynamic Amplifier Achieving Sub-1-dB SNDR Variation," IEEE Journal of Solid-State Circuits, vol. 52, pp. 3235-3247, December 2017.
[8] H. Li, M. Maddox, M. C. W. Coin, W. Buckley, D. Hummerston, and N. Naeem, "A signal-independent background-calibrating 20b 1 MS/S SAR ADC with 0.3 ppm INL," in 2018 IEEE International Solid—State Circuits Conference—(ISSCC), pp. 242-244, February 2018.
[9] B. Verbruggen, K. Deguchi, B. Malki, and J. Craninckx, "A 70 dB SNDR 200 MS/s 2.3 mW dynamic pipelined SAR ADC in 28 nm digital CMOS," in 2014 Symposium on VLSI Circuits Digest of Technical Papers, pp. 1-2, June 2014.
[10] M. Ding, P. Harpe, Y. Liu, B. Busze, K. Philips, and H. de Groot, "26.2 A 5.5 fJ/conv-step 6.4 MS/S 13b SAR ADC utilizing a redundancy-facilitated background error-detection-and-correction scheme," in 2015 IEEE International Solid-State Circuits Conference—(ISSCC) Digest of Technical Papers, pp. 1-3, February 2015.
[11] Y. Shu and B. Song, "A 15-bit Linear 20-MS/s Pipelined ADC Digitally Calibrated With Signal-Dependent Dithering," IEEE Journal of Solid-State Circuits, vol. 43, pp. 342-350, February 2008.
[12] Y. Zhou, B. Xu, and Y. Chiu, "A 12 bit 160 MS/s Two-Step SAR ADC With Background Bit-Weight Calibration Using a Time-Domain Proximity Detector," IEEE Journal of Solid-State Circuits, vol. 50, pp. 920-931, April 2015.
[13] A. Bannon, C. P. Hurrell, D. Hummerston, and C. Lyden, "An 18 b 5 MS/s SAR ADC with 100.2 dB dynamic range," in 2014 Symposium on VLSI Circuits Digest of Technical Papers, pp. 1-2, June 2014.
[14] D. Gubbins, B. Lee, P. K. Hanumolu, and U. Moon, "Continuous-Time Input Pipeline ADCs," IEEE Journal of Solid-State Circuits, vol. 45, pp. 1456-1468, August 2010.
[15] H. Shibata, V. Kozlov, Z. Ji, A. Ganesan, H. Zhu, D. Paterson, J. Zhao, S. Patil, and S. Pavan, "A 9-GS/s 1.125-GHz BW Oversampling Continuous-Time Pipeline ADC Achieving—164-dBFS/Hz NSD," IEEE Journal of Solid-State Circuits, vol. 52, pp. 3219-3234, December 2017.
[16] S. M. Chen and R. W. Brodersen, "A 6-bit 600-MS/s 5.3-mW Asynchronous ADC in 0.13-m CMOS," IEEE Journal of Solid-State Circuits, vol. 41, pp. 2669-2680, December 2006.
[17] V. Tripathi and B. Murmann, "An 8-bit 450-MS/s single-bit/cycle SAR ADC in 65-nm CMOS," in 2013 Proceedings of the ESSCIRC (ESSCIRC), pp. 117-120, September 2013.
[18] P. Harpe, C. Zhou, X. Wang, G. Dolmans, and H. de Groot, "A 30H/conversion-step 8b 0-to-10 MS/s asynchronous SAR ADC in 90 nm CMOS," in 2010 IEEE International Solid-State Circuits Conference—(ISSCC), pp. 388-389, February 2010.
[19] M. Zhang, K. Noh, X. Fan, and E. Snchez-Sinencio, "A 0.81.2 V 1050 MS/s 13-bit Subranging Pipelined-SAR ADC Using a Temperature-Insensitive Time-Based Amplifier," IEEE Journal of Solid-State Circuits, vol. 52, pp. 2991-3005, November 2017.
[20] J. Lin, D. Paik, S. Lee, M. Miyahara, and A. Matsuzawa, "An Ultra-Low-Voltage 160 MS/s 7 Bit Interpolated Pipeline ADC Using Dynamic Amplifiers," IEEE Journal of Solid-State Circuits, vol. 50, pp. 1399-1411, June 2015.
[21] C. Liu and M. Huang, "28.1 A 0.46 mW 5 MHz-BW 79.7 dB-SNDR noise-shaping SAR ADC with dynamic-amplifier-based FIR-IIR filter," in 2017 IEEE International Solid-State Circuits Conference (ISSCC), pp. 466-467, February 2017.
[22] L. Shen, Y. Shen, X. Tang, C. Hsu, W. Shi, S. Li, W. Zhao, A. Mukherjee, and N. Sun, "3.4 A 0.01 mm2 25 W 2 MS/s 74 dB-SNDR Continuous-Time Pipelined-SAR ADC with 120 fF Input Capacitor," in 2019 IEEE International Solid-State Circuits Conference—(ISSCC), pp. 64-66, February 2019.
[23] R. R. Harrison, P. T. Watkins, R. J. Kier, R. O. Lovejoy, D. J. Black, B. Greger, and F. Solzbacher, "A Low-Power Integrated Circuit for a Wireless 100-Electrode Neural Recording System," IEEE Journal of Solid-State Circuits, vol. 42, pp. 123-133, January 2007.
[24] L. Shen, N. Lu, and N. Sun, "A 1-V 0.25-W Inverter Stacking Amplifier With 1.07 Noise Efficiency Factor," IEEE Journal of Solid-State Circuits, vol. 53, pp. 896-905, March 2018.
[25] W. Kim, H. Hong, Y. Roh, H. Kang, S. Hwang, D. Jo, D. Chang, M. Seo, and S. Ryu, "A 0.6 V 12 b 10 MS/s Low-Noise Asynchronous SAR-Assisted Time-Interleaved SAR (SATI-SAR) ADC," IEEE Journal of Solid-State Circuits, vol. 51, pp. 1826-1839, August 2016.
[26] J. Guerber, H. Venkatram, M. Gande, A. Waters, and U. Moon, "A 10-b Ternary SAR ADC With Quantization Time Information Utilization," IEEE Journal of Solid-State Circuits, vol. 47, pp. 2604-2613, November 2012.
[27] C. C. Lee and M. P. Flynn, "A SAR-Assisted Two-Stage Pipeline ADC," IEEE Journal of Solid-State Circuits, vol. 46, pp. 859-869, April 2011.
[28] H. Garvik, C. Wulff, and T. Ytterdal, "An 11.0 bit ENOB, 9.8 fJ/conv.-step noise-shaping SAR ADC calibrated by least squares estimation," in 2017 IEEE Custom Integrated Circuits Conference (CICC), pp. 1-4, April 2017.
[29] M. Gandara, P. Gulati, and N. Sun, "A 172 dB-FoM pipelined SAR ADC using a regenerative amplifier with self-timed gain control and mixed-signal background calibration," in 2017 IEEE Asian Solid-State Circuits Conference (A-SSCC), pp. 297-300, November 2017.
[30] S. Li, B. Qiao, M. Gandara, D. Z. Pan, and N. Sun, "A 13-ENOB Second-Order Noise-Shaping SAR ADC Realizing Optimized NTF Zeros Using the Error-Feedback Structure," IEEE Journal of Solid-State Circuits, vol. 53, pp. 3484-3496, December 2018.
[31] M. S. Akter, K. A. A. Makinwa, and K. Bult, "A Capacitively Degenerated 100-dB Linear 20-150 MS/s Dynamic Amplifier," IEEE Journal of Solid-State Circuits, vol. 53, pp. 1115-1126, April 2018.
[32] M. Gandara, W. Guo, X. Tang, L. Chen, Y. Yoon, and N. Sun, "A pipelined SAR ADC reusing the comparator as residue amplifier," in 2017 IEEE Custom Integrated Circuits Conference (CICC), pp. 1-4, April 2017.

What is claimed is:
1. An analog-to-digital converter (ADC) comprising:
a first successive approximation register circuit configured to perform a plurality of successive continuous-time approximations of an input waveform to generate, at an output of the first successive approximation register circuit, a continuous-time residue signal and a first set of converted outputs, wherein the first successive approximation register circuit is configured to simultaneously perform input tracking and successive approximation register quantization;
a sampling circuit coupled to the output of the first successive approximation register circuit to sample and hold the continuous-time residue signal after the successive continuous-time approximations; and
a second successive approximation register circuit coupled to an output of the sampling circuit to perform a plurality of successive discrete-time approximations of the sampled residue signal to generate a second set of converted outputs, wherein the first set of converted outputs and the second set of converted outputs are used to generate an output of the analog-to-digital converter.

2. The analog-to-digital converter (ADC) of claim 1, further comprising:
an inter-stage amplifier serially located between the output of the first successive approximation register and the sampling circuit, the inter-stage amplifier being configured as a low-pass filter.

3. The analog-to-digital converter (ADC) of claim 2, wherein the inter-stage amplifier is configured as a floating inverter-based (FIB) dynamic amplifier (DA) configured with a linear integration operation and a positive-feedback regeneration operation.

4. The analog-to-digital converter (ADC) of claim 2, wherein the inter-stage amplifier comprises a filter circuit and a gain amplifier circuit.

5. The analog-to-digital converter (ADC) of claim 1, wherein the second successive approximation register circuit comprises redundancy of the first successive approximation register circuit, the analog-to-digital converter further comprising:
a summing circuit coupled to the first successive approximation register circuit and the second successive approximation register circuit, wherein the summing circuit is configured to perform a weighted sum operation of at least a portion the first set of converted outputs and at least a portion of the second set of converted outputs.

6. The analog-to-digital converter (ADC) of claim 1, wherein the first successive approximation register circuit and the second successive approximation register circuit are capacitively-coupled.

7. The analog-to-digital converter (ADC) of claim 1, wherein the analog-to-digital converter are implemented, in part, using at least one of CMOS, NMOS, PMOS process.

8. The analog-to-digital converter (ADC) of claim 1, wherein the ADC is configured as at least one of an 8-bit ADC, a 9-bit ADC, a 10-bit ADC, a 11-bit ADC, a 12-bit ADC, a 13-bit ADC, a 14-bit ADC, a 15-bit ADC, a 16-bit ADC, a 17-bit ADC, a 18-bit ADC, a 19-bit ADC, a 20-bit ADC, a 21-bit ADC, a 22-bit ADC, a 23-bit ADC, and a 24-bit ADC.

9. The analog-to-digital converter (ADC) of claim 1, wherein the first successive approximation register circuit comprises an input capacitor, the input capacitor having a capacitance less than 120 fF for a 13-bit conversion.

10. The analog-to-digital converter (ADC) of claim 1, wherein the first successive approximation register circuit comprises an input capacitor, the input capacitor being sub-pico-Farad.

11. The analog-to-digital converter (ADC) of claim 1, wherein the first successive approximation register circuit forms a CT-SAR based 1st-stage that does not include a sample-and-hold circuit.

12. The analog-to-digital converter (ADC) of claim 1, wherein the first successive approximation register circuit is configured to perform a single-bit comparison, a single-bit DAC, and a subtraction operation for each respective CT-SAR cycle.

13. A method of converting an input analog signal to an output digital signal representing the input analog signal, the method comprising:
successively approximating, via a circuit, over a first set of plurality of approximations, a residue signal of the input analog signal to determine a first set of converted outputs of the digital signal, wherein at each first set of plurality of approximations one or more additional converted outputs of the first set of converted outputs are determined and an aggregated set of the generated first set of converted outputs bits is used to generate a signal that is combined to the input analog signal;
sampling, via the circuit, the residual signal after the plurality of approximations the residue signal;
successively approximating, via the circuit, over a second set of plurality of approximations, the sampled residue signal to determine a second set of converted outputs of the digital signal;
simultaneously performing both input tracking and SAR quantization over the first set of plurality of approximations as a part of the step to successively approximating the residue signal of the input analog signal;
combining, via the circuit, the first set of converted outputs and the second set of converted outputs to generate the output digital signal representing the input analog signal; and
outputting, via the circuit, the output digital signal.

14. The method of claim 13, wherein the steps are performed within a single ADC conversion cycle.

15. The method of claim 13, wherein the step of simultaneously performing both input tracking comprises:
adding, via the circuit, at each of the first set of plurality of approximations after a first approximation, the successively approximated residue signal of the input analog signal to the input signal analog signal while allowing the input analog signal to float.

16. The method of claim 13, further comprising:
performing, via the circuit, a low-pass operation prior to the sampling step and after the successively approximating step to generate the residue signal.

17. The method of claim 13, further comprising:
performing, via the circuit, a low-pass and gain operation prior to the sampling step and after the successively approximating step to generate the residue signal.

18. The method of claim 13, wherein the step of successively approximating the sampled residue signal to determine a second set of converted outputs comprises redundancy of the first successive approximation operation, the method further comprising:
performing, via the circuit, a weighted sum operation of at least a portion the first set of converted outputs and at least a portion of the second set of converted outputs.

19. An analog-to-digital converter (ADC) or electric circuit comprising:
a first successive approximation register circuit configured to perform a plurality of successive continuous-time approximations of an input waveform to generate, at an output of the first successive approximation register circuit, a continuous-time residue signal and a first set of converted outputs;

a sampling circuit coupled to the output of the first successive approximation register circuit to sample and hold the continuous-time residue signal after the successive continuous-time approximations;

a second successive approximation register circuit coupled to an output of the sampling circuit to perform a plurality of successive discrete-time approximations of the sampled residue signal to generate a second set of converted outputs, wherein the first set of converted outputs and the second set of converted outputs are used to generate an output of the analog-to-digital converter; and an inter-stage amplifier serially located between the output of the first successive approximation register and the sampling circuit, the inter-stage amplifier being configured as a low-pass filter.

20. The analog-to-digital converter (ADC) or electric circuit of claim 19, wherein the inter-stage amplifier is configured as a floating inverter-based (FIB) dynamic amplifier (DA) configured with a linear integration operation and a positive-feedback regeneration operation.

21. The analog-to-digital converter (ADC) or electric circuit of claim 19, wherein the inter-stage amplifier comprises a filter circuit and a gain amplifier circuit.

22. An analog-to-digital converter (ADC) or electric circuit comprising:
a first successive approximation register circuit configured to perform a plurality of successive continuous-time approximations of an input waveform to generate, at an output of the first successive approximation register circuit, a continuous-time residue signal and a first set of converted outputs;

a sampling circuit coupled to the output of the first successive approximation register circuit to sample and hold the continuous-time residue signal after the successive continuous-time approximations; and a second successive approximation register circuit coupled to an output of the sampling circuit to perform a plurality of successive discrete-time approximations of the sampled residue signal to generate a second set of converted outputs, wherein the first set of converted outputs and the second set of converted outputs are used to generate an output of the analog-to-digital converter, wherein the second successive approximation register circuit comprises redundancy of the first successive approximation register circuit, the analog-to-digital converter further comprising:

a summing circuit coupled to the first successive approximation register circuit and the second successive approximation register circuit, wherein the summing circuit is configured to perform a weighted sum operation of at least a portion the first set of converted outputs and at least a portion of the second set of converted outputs.

23. An analog-to-digital converter (ADC) or electric circuit comprising:
a first successive approximation register circuit configured to perform a plurality of successive continuous-time approximations of an input waveform to generate, at an output of the first successive approximation register circuit, a continuous-time residue signal and a first set of converted outputs;

a sampling circuit coupled to the output of the first successive approximation register circuit to sample and hold the continuous-time residue signal after the successive continuous-time approximations; and a second successive approximation register circuit coupled to an output of the sampling circuit to perform a plurality of successive discrete-time approximations of the sampled residue signal to generate a second set of converted outputs, wherein the first set of converted outputs and the second set of converted outputs are used to generate an output of the analog-to-digital converter, wherein the first successive approximation register circuit and the second successive approximation register circuit are capacitively-coupled.

24. The analog-to-digital converter (ADC) or electric circuit of claim 23, wherein the first successive approximation register circuit comprises an input capacitor, the input capacitor being sub-pico-Farad.

25. An analog-to-digital converter (ADC) or electric circuit comprising:
a first successive approximation register circuit configured to perform a plurality of successive continuous-time approximations of an input waveform to generate, at an output of the first successive approximation register circuit, a continuous-time residue signal and a first set of converted outputs;

a sampling circuit coupled to the output of the first successive approximation register circuit to sample and hold the continuous-time residue signal after the successive continuous-time approximations; and a second successive approximation register circuit coupled to an output of the sampling circuit to perform a plurality of successive discrete-time approximations of the sampled residue signal to generate a second set of converted outputs, wherein the first set of converted outputs and the second set of converted outputs are used to generate an output of the analog-to-digital converter, wherein the first successive approximation register circuit is configured to perform a single-bit comparison, a single-bit DAC, and a subtraction operation for each respective CT-SAR cycle.

\* \* \* \* \*